(12) United States Patent
Mueller et al.

(10) Patent No.: US 8,379,188 B2
(45) Date of Patent: Feb. 19, 2013

(54) OPTICAL SYSTEM

(75) Inventors: Ralf Mueller, Aalen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 275 days.

(21) Appl. No.: 12/782,831

(22) Filed: May 19, 2010

(65) Prior Publication Data

US 2010/0231888 A1    Sep. 16, 2010

Related U.S. Application Data

(63) Continuation of application No. PCT/EP2008/065733, filed on Nov. 18, 2008.

(60) Provisional application No. 60/989,249, filed on Nov. 20, 2007.

(30) Foreign Application Priority Data

Nov. 20, 2007 (DE) .......................... 10 2007 055 567

(51) Int. Cl.
  *G03B 27/72* (2006.01)
  *G03B 27/54* (2006.01)
(52) U.S. Cl. ...................................................... 355/71
(58) Field of Classification Search .................. 355/52, 355/53, 55, 67–71
See application file for complete search history.

(56) References Cited

U.S. PATENT DOCUMENTS

| | | | |
|---|---|---|---|
| 3,052,152 A | 9/1962 | Koester | |
| 4,643,534 A | 2/1987 | Chun et al. | |
| 5,377,040 A | 12/1994 | Naganuma | |
| 6,104,472 A | 8/2000 | Suzuki | |
| 6,252,712 B1 | 6/2001 | Fuerter et al. | |
| 6,665,126 B2 | 12/2003 | Shafer et al. | |
| 6,930,758 B2 | 8/2005 | Schuster et al. | |
| 2003/0099047 A1 | 5/2003 | Hoffman et al. | |
| 2003/0137733 A1 | 7/2003 | Gerhard et al. | |
| 2004/0150806 A1 | 8/2004 | Brunotte et al. | |
| 2004/0218271 A1 | 11/2004 | Hartmaier et al. | |
| 2005/0013012 A1 | 1/2005 | Kurz et al. | |
| 2005/0146704 A1 | 7/2005 | Gruner et al. | |
| 2005/0231813 A1 | 10/2005 | Rostalski et al. | |
| 2006/0028706 A1 | 2/2006 | Totzeck et al. | |
| 2006/0055834 A1* | 3/2006 | Tanitsu et al. ..................... 349/5 |
| 2006/0110604 A1 | 5/2006 | Mizuguchi et al. | |

(Continued)

FOREIGN PATENT DOCUMENTS

| DE | 101 62 796 | 7/2003 |
|---|---|---|
| DE | 10 2005 030 543 | 2/2006 |

(Continued)

OTHER PUBLICATIONS

Japanese Office Action, with English translation, for corresponding JP Appl. No. 2010-534455, dated Mar. 27, 2012.

(Continued)

*Primary Examiner* — Hung Henry Nguyen
(74) *Attorney, Agent, or Firm* — Fish & Richardson P.C.

(57) ABSTRACT

The disclosure provides an optical system having an optical axis, where the optical system includes a polarization manipulator which includes first and second subelements. The first subelement has a non-planar, optically effective surface. For light passing through the first subelement, the first subelement causes a change in the polarization state. A maximum effective retardation introduced by the first subelement along the optical axis is less than a quarter of the working wavelength of the optical system. The first subelement and the second subelement have mutually facing surfaces which are mutually complementary. The optical system also includes a position manipulator to manipulate the relative position of the first and second subelements.

36 Claims, 17 Drawing Sheets

U.S. PATENT DOCUMENTS

| | | |
|---|---|---|
| 2007/0146676 A1 | 6/2007 | Tanitsu et al. |
| 2007/0183017 A1 | 8/2007 | Hembd |
| 2007/0211246 A1 | 9/2007 | Kraehmer et al. |
| 2007/0263199 A1 | 11/2007 | Fiolka et al. |
| 2008/0036992 A1 | 2/2008 | Mori et al. |
| 2008/0174759 A1 | 7/2008 | Schuster |
| 2008/0316444 A1 | 12/2008 | Sorg et al. |
| 2009/0115989 A1* | 5/2009 | Tanaka .................. 355/71 |

FOREIGN PATENT DOCUMENTS

| | | |
|---|---|---|
| DE | 10 2007 059 258 | 7/2008 |
| EP | 1 480 065 | 11/2004 |
| EP | 1 621 930 | 2/2006 |
| JP | 61-181920 | 8/1986 |
| JP | 61-503054 | 12/1986 |
| JP | 4-191703 | 7/1992 |
| JP | 2003-532281 | 10/2003 |
| JP | 2004-525527 | 8/2004 |
| JP | 2004-535603 | 11/2004 |
| JP | 2005-508018 | 3/2005 |
| JP | 2006-513443 | 4/2006 |
| JP | 2006-253327 | 9/2006 |
| JP | 2007-506990 | 3/2007 |
| JP | 2007-515768 | 6/2007 |
| JP | 2007-189079 | 7/2007 |
| JP | 2007-316634 | 12/2007 |
| JP | 2008-047673 | 2/2008 |
| JP | 2008-177581 | 7/2008 |
| JP | 2009-508170 | 2/2009 |
| WO | WO 86/01302 | 2/1986 |
| WO | WO 01/81977 A2 | 11/2001 |
| WO | WO 03/009021 | 1/2003 |
| WO | WO 03/023481 | 3/2003 |
| WO | WO 03/075096 | 9/2003 |
| WO | WO 2004/019128 | 3/2004 |
| WO | WO 2004/051717 | 6/2004 |
| WO | WO 2005/005694 | 1/2005 |
| WO | WO 2005/010963 | 2/2005 |
| WO | WO 2005/024474 | 3/2005 |
| WO | WO 2005/031467 | 4/2005 |
| WO | WO 2005/069055 | 7/2005 |
| WO | WO 2005/069081 | 7/2005 |
| WO | WO 2005/083517 | 9/2005 |
| WO | WO 2005/116772 | 12/2005 |
| WO | WO 2006/077849 | 7/2006 |
| WO | WO 2006/131517 | 12/2006 |
| WO | WO 2007/031544 | 3/2007 |
| WO | WO 2007/055120 * | 5/2007 |
| WO | WO 2007/085290 | 8/2007 |

OTHER PUBLICATIONS

International Preliminary Report on Patentability for the corresponding PCT Application No. PCT/EP2008/065733, dated May 25, 2010.
European Office Action for corresponding EP Appl No. 08 851 993.9, dated May 12, 2011.

* cited by examiner

OPTICAL SYSTEM

CROSS-REFERENCE TO RELATED APPLICATIONS

This application is a continuation of, and claims benefit under 35 USC 120 to, international application PCT/EP2008/065733, filed Nov. 18, 2008, which claims benefit of German Application No. 10 2007 055 567.0, filed Nov. 20, 2007 and U.S. Ser. No. 60/989,249, filed Nov. 20, 2007. International application PCT/EP2008/065733 is hereby incorporated by reference in its entirety.

FIELD

The disclosure concerns an optical system, in particular an optical system of a microlithographic projection exposure apparatus.

BACKGROUND

Microlithography is used for the production of microstructured components such as for example integrated circuits or LCDs. The microlithography process is carried out in what is referred to as a projection exposure apparatus having an illumination system and a projection objective. The image of a mask (=reticle) is illuminated via the illumination system and projected via the projection objective onto a substrate (for example a silicon wafer) which is coated with a light-sensitive layer (photoresist) and arranged in the image plane of the projection objective to transfer the mask structure onto the light-sensitive coating on the substrate.

Various approaches are known for specifically targetedly implementing adjustments or corrections with respect to polarization distribution in the illumination system or in the projection objective for optimizing the imaging contrast.

WO 2005/069081 A2 discloses, for example, a polarization-influencing optical element that includes an optically active crystal and a thickness profile which varies in the direction of the optical axis of the crystal.

It is known, for example, from US 2007/0146676 A1 to arrange in the illumination system a polarization manipulator for conversion of the polarization state, including a multiplicity of variable optical rotator elements by which the polarization direction of impinging linearly polarized light can be rotated with variably adjustable rotational angles.

WO 2005/031467 A2 discloses, for example, in a projection exposure apparatus, influencing the polarization distribution via one or more polarization manipulator devices which can also be arranged at a plurality of positions and which can be in the form of polarization-influencing optical elements which can be introduced into the beam path, where the effect of those polarization-influencing elements can be varied by altering the position, for example rotation, decentering or tilting of the elements.

U.S. Pat. No. 6,252,712 discloses, for example, a polarization compensator including two birefringent elements which are each provided with a free-form surface and which involve mutually rotated optical crystal axes.

It is known, for example, from U.S. Pat. No. 6,104,472 to use optical elements of quartz glass or calcium fluoride for controlling axial astigmatism, where the elements have mutually complementary aspheric surfaces and are arranged displaceably relative to each other with respect to their relative position.

SUMMARY

In practice, a problem which can also arise is that changes in the polarization distribution can occur in dependence on time and possibly varying at high frequency, as is the case, for example, with respect to stress birefringence effects, which vary over the service life, in optical elements, or in the case of changes in the desired polarization distribution in the optical system as a consequence of a change in the illumination setting (for example from what is referred to as x-dipole-illumination setting to what is referred to as y-dipole-illumination setting). Another example is polarization-induced birefringence ("PBR"), which increases in its amplitude in the course of time with illumination with the same illumination setting.

The disclosure provides an optical system which permits effective compensation of disturbances which are variable in time in polarization distribution.

In some embodiments, the disclosure provides an optical system which has an optical axis. The optical system includes:

at least one polarization manipulator having a first subelement which has a non-planar, optically effective surface. For light passing therethrough, the polarization state changes. A maximum effective retardation introduced by the first subelement along the optical axis is less than a quarter of the working wavelength of the optical system. The at least one polarization manipulator also includes a second subelement. The first and second subelements have mutually facing surfaces which are mutually complementary; and a position manipulator for manipulation of the relative position of the first and second subelements.

The term retardation is used to denote the difference in the optical paths of two orthogonal (mutually perpendicular) polarization states. In addition, reference to an effective retardation which is introduced along the optical axis is used to denote the "modulo $\lambda$" retardation (that is to say instead of a retardation of, for example, a fifth of the working wavelength $\lambda$ of the optical system, it is also possible to set a retardation $\lambda+0.2*\lambda$, $2\lambda+0.2*\lambda$ etc., which differs only by an integral multiple of the working wavelength $\lambda$). In addition, as is also stated in greater detail hereinafter, manipulation of the position of that subelement in relation to the optical axis can involve both any rotation and also displacement of the subelement as well as a combination of such movements.

Via the manipulation of the position of the subelement, the amplitude of the retardation set by the subelement can be specifically targetedly manipulated, and it is thus possible, in particular, to compensate for a disturbance, which varies with respect to time, in the polarization distribution. In that respect the position of the subelement is defined by the positional coordinates (x, y and z) as well as the rotary angles with respect to a coordinate system which contains the optical axis as the z-axis.

According to a further aspect, the disclosure also provides an optical system which has an optical axis and includes at least one polarization manipulator having at least one subelement which has a non-planar, optically effective surface and, for light passing therethrough, causes a change in the polarization state. A maximum effective retardation introduced by the subelement along the optical axis is less than a quarter of the working wavelength of the optical system. The optical system also includes a position manipulator for manipulation of the position of that subelement.

In some embodiments, the non-planar surface is an aspheric surface.

In certain embodiments, the polarization manipulator in addition to the first subelement has at least one second subelement. The position manipulator can be adapted to change the relative position of the first and second subelements.

The disclosure makes use of the realization that, in the polarization manipulator, upon a change in the relative position of the two mutually facing surfaces which in particular can both be aspheric and mutually complementary or mutually inverse, the polarization action on the light passing through the two subelements can be described as a good approximation by way of the derivative of a function describing the aspheric surface, in accordance with that relative movement, where the degree of the polarization manipulation implemented, within a certain linearity range, scales substantially linearly with the amplitude of the relative movement. Accordingly, the amplitude of a retardation set by the polarization manipulator can be manipulated and thus a disturbance, which varies with respect to time, in the polarization distribution can be specifically compensated, by relative displacement of the two subelements.

In some embodiments, the mutually facing surfaces are both of an aspheric configuration. Furthermore, the mutually facing aspheric surfaces can be mutually complementary. In particular the two sub elements, when the other surfaces are in the form of plane surfaces, can supplement each other thereby forming an overall plane-parallel geometry.

In certain embodiments, at least one of the subelements causes a change in the polarization state by linear birefringence, circular birefringence and/or by transmission splitting between orthogonal polarization states (that is to say, by a change in the amplitude relationship of orthogonal polarization states in dependence on the orientations thereof).

In some embodiments, the polarization manipulator is arranged in a plane in which the paraxial subaperture ratio is at least 0.8. In accordance with a further exemplary embodiment, the polarization manipulator is arranged in a plane in which the paraxial subaperture ratio is at a maximum 0.2. In that respect the paraxial subaperture ratio S is defined as:

$$S = \frac{r}{|h| + |r|} \operatorname{sgn} h \quad (1)$$

where r denotes the paraxial marginal ray height and h denotes the paraxial principal ray height. In the equation sgn(x) denotes what is referred to as the signum function, wherein by definition sgn(0)=1 can be set.

The term principal ray is used to denote a ray which comes from an object point which in the object plane is at the greatest distance relative to the optical axis and which in the pupil plane intersects the optical axis. The term marginal ray is used to denote a ray from the point of intersection of the object field plane with the optical axis and which with maximum aperture opening passes through the edge of the aperture stop. In the case of extra-axial object fields this involves a notional ray which does not contribute to imaging of the object in the image space.

The paraxial subaperture ratio S represents a parameter that includes a sign, being a measurement with respect to the field or pupil proximity of a plane in the optical system. In that respect, in accordance with its definition, the subaperture ratio is standardized to values between −1 and +1, wherein a zero point of the paraxial subaperture ratio corresponds to each field plane and wherein a discontinuity point with a leap in the paraxial subaperture ratio from −1 to +1 or from +1 to −1 corresponds to each pupil plane. Accordingly, planes with a paraxial subaperture ratio of at least 0.8 represent planes near the pupil whereas planes with a paraxial subaperture ratio of a maximum 0.2 represent planes near the field. In that case the sign of the paraxial subaperture ratio specifies the arrangement of the plane in front of or behind a reference plane. It is possible for example to involve the sign of the point of intersection of a coma ray in the plane in question, for definition purposes.

In certain embodiments, the optical system has at least two of the above-described polarization manipulators. That design configuration has the advantage that it is possible to limit the displacement travel of the respective individual polarization manipulators. In some embodiments, the polarization manipulators are arranged in such a way that the paraxial subaperture ratios at the locations of those polarization manipulators differ from each other by at least 0.1, such as at least 0.15. Such a design configuration has the advantage that it is possible to influence both field-constant pupil effects and also field variations or to achieve compensation in that respect, by one of the polarization manipulators being arranged comparatively closer to the field than the other of the polarization manipulators.

In certain embodiments, the optical system further has a wave front compensator, that is to say an element for altering the wave front. That takes account of the fact that, besides the desired influence on the polarization state of the light passing therethrough, the polarization manipulator additionally has a scalar action or a wave front contribution which is generally undesired and which can be compensated by the additional wave front compensator. The wave front compensator can be a conventional, so-called Alvarez manipulator, a deformable mirror, a deformable refractive element or an optical element which can be locally heated and/or cooled for example via a flow of liquid or gas, via irradiation of light of typically differing wavelength (for example infrared radiation) or by way of heating wires.

The additional wave front compensator can be arranged at a position with a paraxial subaperture ratio which involves a sign and which is similar relative to the polarization manipulator (for example with a paraxial subaperture ratio differing by a maximum of 20%), whereby good wave front correction can be achieved. The inclusion of a wave front compensator is not limited to a wave front compensator which is variable with respect to time in its setting but it is also possible for a suitable interchangeable element to be appropriately aspherized as the wave front compensator and to be respectively interchanged upon adjustment of the polarization manipulator.

In some embodiments, at least one of the mutually facing surfaces has a coating. At least one of those surfaces has a reflectivity of less than 2%, such as less than 1%. In that way it is possible to reduce or minimize unwanted interference effects.

In certain embodiments, disposed between the first subelement and the second subelement is a gap which for example can be filled with air or another gas (e.g., an inert gas) or also with a liquid medium. The gap can be filled with a liquid medium which is adapted with respect to its refractive index, that is to say the liquid medium in the gap has a refractive index which, at a working wavelength of the optical system, differs by less than 0.2, such as less than 0.15, from a mean refractive index of the first and second subelements. Such a refractive index-adapted medium makes it possible to reduce or minimize any unwanted wave front action on the part of the polarization manipulator so that additional wave front compensators can be of a simple design in their structure or can even be entirely omitted.

In some embodiments, an optical system has an optical axis, and the optical system includes a position manipulator adapted to effect one of the following changes in the relative position of the subelements or a combination of such changes:

displacement of at least one of the subelements in a direction perpendicular to the optical axis;

displacement of at least one of the subelements in a direction parallel to the optical axis;

rotation of at least one of the subelements about an axis of rotation parallel to the optical axis; or rotation of at least one of the subelements about an axis of rotation which is not parallel to the optical axis.

The term optical axis of an optical system is used to denote that axis (or a succession of straight axis portions) which passes through the center points of the rotationally symmetrical optical components of the system. In that respect an axis of rotation which is parallel to the optical axis can coincide with or also be different from the optical axis of the system. Furthermore an axis of rotation which is not parallel to the optical axis of the system (that is to say an axis of rotation tilted relative to that optical axis) can extend through a center of one of the subelements or both subelements, or can also not extend through such a center. If the optical system is what is referred to as an extra-axial system the axis of rotation can in particular also pass through the center of the optically used region of the extra-axial system.

In some embodiments, a device for heating and/or cooling at least one of the subelements can be present. This can afford an additional degree of freedom for setting the mean refractive index of the subelements, and in particular it is possible to set a desired effect on the wave front and it is also possible to minimize a wave front action on the part of the polarization manipulator due to a change in temperature.

In certain embodiments, the spacing between the first subelement and the second subelement along the optical axis of the system is at a maximum 0.5 mm (e.g., at a maximum 0.4 mm, at a maximum 0.3 mm).

In some embodiments, provided between the first and second subelements is a gap which is at least partially filled with a fluid. In that case the fluid can be both a liquid fluid and also a gaseous fluid (e.g., a high-refraction fluid). In accordance with an exemplary embodiment, the fluid is a liquid medium.

In some embodiments, the first and second subelements can be made from the same material.

In accordance with a further exemplary embodiment, the first and second subelements are made from different materials. For example the first subelement can be made from magnesium fluoride ($MgF_2$), and the second subelement can be made from sapphire ($Al_2O_3$). In this example, the first and second subelements have different signs in their birefringence.

In particular the first and second subelements can be respectively made from a crystal material, in which case the orientation of a crystal axis of the first subelement can differ from the orientation of a crystal axis of the second subelement by an angle of more than 5°, such as by an angle of more than 10°. Insofar as in that case different retardation distributions are mutually superposed, as a result it is possible to set a desired integral birefringence distribution, by suitable superpositioning.

In some embodiments, the polarization manipulator in a predetermined starting position of the at least one subelement leaves unchanged the polarization state of light passing therethrough (in particular light incident in parallel relationship with the optical axis on the polarization manipulator).

The polarization manipulator can have both at least one subelement of positively birefringent crystal material and also at least one subelement of negatively birefringent crystal material. In that respect in the present case the term positively birefringent crystal material denotes a crystal material in which the extraordinary refractive index $n_e$ is greater than the ordinary refractive index $n_o$, that is to say the value $n_e-n_o$ is greater than zero (for example magnesium fluoride ($MgF_2$)). The term negatively birefringent crystal material denotes crystal material in which the extraordinary refractive index $n_e$ is smaller than the ordinary refractive index $n_o$, that is to say the value $n_e-n_o$ is smaller than zero (for example sapphire ($Al_2O_3$)).

In that case, a suitable choice of the total thicknesses of positively birefringent material on the one hand and negatively birefringent material on the other hand in the polarization manipulator in dependence on the respective refractive indices of the subelements, for example in a starting position of the polarization manipulator, makes it possible to achieve a behavior which overall is substantially polarization-neutral, where the variation in the relative position of the two subelements leads to polarization influencing which can be adjusted in the desired manner.

In accordance with further exemplary embodiments which can be implemented in combination with the above-specified design configurations or alternatively thereto, the two subelements can be mechanically stressed to different or identical degrees, they can be doped in identical or different ways and/or they can be coated in identical or different ways. In particular such a coating can be an anti-reflection coating whereby it is possible to reduce or minimize unwanted interference effects.

In some embodiments, the polarization manipulator can be arranged interchangeably, whereby optimum adaptation to the respective factors involved can be achieved under different conditions of use.

In certain embodiments, the polarization manipulator, in a predetermined starting position of the subelements, leaves the polarization state of light passing therethrough unchanged.

In some embodiments, the polarization manipulator is configured such that a wave front for p-polarized light passing therethrough and a wave front for s-polarized light passing therethrough are manipulated by the polarization manipulator different from each other, wherein the manipulation of the mean value of the wave fronts for p-polarized light and for s-polarized light is different from zero.

The disclosure also provides a polarization manipulator including a first subelement and at least one second subelement which respectively cause a change in the polarization state for light passing therethrough and have mutually complementary aspheric surfaces, where by manipulation of the relative position of the first and second subelements relative to each other, it is possible to set a change in the polarization state, that varies with the manipulation, and where the polarization manipulator in a predetermined starting position of the first and second subelements leaves the polarization state of light passing therethrough unchanged (in particular of light incident parallel to an element axis of the polarization manipulator or relative to the optical system axis thereon).

In principle, the system can be any optical system, such as, for example, a mask testing device, an illumination system, or a respective subsystem thereof. In accordance with an exemplary embodiment, the optical system is an optical system of a microlithographic projection exposure apparatus, such as a projection objective or an illumination system of the microlithographic projection exposure apparatus or a subsystem thereof.

In accordance with a further aspect, the disclosure also provides a polarization manipulator configured so that a wave front for p-polarized light passing therethrough and a wave front for s-polarized light passing therethrough are manipulated by the polarization manipulator different from each other. The manipulation of the mean value of the wave fronts for p-polarized light and for s-polarized light is different from zero.

According to this approach, the wave front for p-polarized light may in particular be manipulated in the optical system including the polarization manipulator independently and/or different (i.e. to another extent) compared to the wave front for s-polarized light. While the mean value of the two wave fronts for p- and s-polarized light represents what is usually referred to as the "wave front", the difference value of these two wave fronts represents what is usually referred to as birefringence or retardation of the system. Accordingly, the different manipulation of the wave front for p-polarized light, on the one hand, and of the wave front for s-polarized light, on the other hand, implies a change also in the mean value of the wave fronts for p- and s-polarized light. Furthermore, a change in the relative positions of the first and second subelement not only affects the birefringence, i.e. the difference between the wave fronts for p- and s-polarized light, but also affects the mean value of the wave fronts for p- and s-polarized light.

By deliberately exploiting a change also of the mean value of the wave fronts for p- and s-polarized light (i.e. not only a change of birefringence), the disclosure in the foregoing approach deviates from conventional approaches for polarization manipulators where only the birefringence is manipulated and where a modification of the mean value of the wave fronts for p- and s-polarized light is not desired and therefore avoided (since the mean value is usually manipulated by further, additional wave front manipulators).

According the above described approach, the disclosure in particular enables to account for effects such as degradation of material(s) in the optical components. Such degradations usually have effects to both the birefringence and the mean value of the wave fronts for p- and s-polarized light. The manipulator may now be configured to account for, or correct, respectively, both of these properties/quantities. More specifically, a change in the relative positions of the first and second subelement may be realized such that undesired changes in both the mean value and the difference value of the wave fronts for p- and s-polarized light due to degradation of material(s) in the optical components are at least partially compensated. Such an approach is particularly advantageous in situations where the aforementioned degradation of material(s) in the optical components occur in a specific and application-dependent manner as a result of using specific illumination settings, specific mechanical stresses and accompanying compaction effects, or other specific operating conditions. Since these effects result in undesired changes of both the mean value and the difference value of the wave fronts for p- and s-polarized light, the inventive approach makes it possible to account for both of these values in a flexible manner adapted to the specific operating conditions.

Furthermore, the foregoing inventive approach makes it possible to e.g. dynamically enhance the correction amount concerning the mean value and the difference value of the wave fronts for p- and s-polarized light to account for an increasing degradation of material(s) in the optical components which may e.g. result from a continuing load in irradiation. If W_p denotes the wave front (or "phase surface") for p-polarized light and W_s denotes the wave front (or "phase surface") for s-polarized light, a relative displacement of the first and second subelement by e.g. 1 mm may be given as $\alpha*W\_p+\beta*W\_s$, wherein the ratio of $\alpha$ and $\beta$ is a specific ratio for the given manipulator. Further, a relative displacement of the first and second subelement by e.g. 2 mm may be given as $2\alpha*W\_p+2\beta*W\_s$, etc. Thereby, a dynamically increasing manipulation of W_p and W_s may be realized to e.g. account for an increasing degradation of material(s) in the optical components.

In accordance with a further aspect, the disclosure provides a microlithographic projection exposure apparatus having an illumination system and a projection objective, wherein the illumination system or the projection objective has an optical system having the above-described features.

In certain embodiments, the projection objective has a numerical aperture of more than 0.85, such as more than 1.1. With numerical apertures of that kind, part of the microlithographic imaging process involves polarization effects which are correctable in accordance with the disclosure. The projection exposure apparatus can be designed in particular for immersion mode of operation. The term immersion mode is used to mean that an immersion liquid is disposed between the last surface of the projection objective and the layer to be exposed.

In some embodiments, the exposure apparatus includes a first disturbance of the mean value of the wave fronts for p- and s-polarized light and a second disturbance of the difference value of the wave fronts for p- and s-polarized light, wherein the first disturbance and the second disturbance are each at least partially compensated by the polarization manipulator.

The disclosure also provides a process for the microlithographic production of micro structured components.

BRIEF DESCRIPTION OF THE DRAWINGS

Further configurations are to be found in the description, claims and figures, in which:

DETAILED DESCRIPTION

Figure 1:
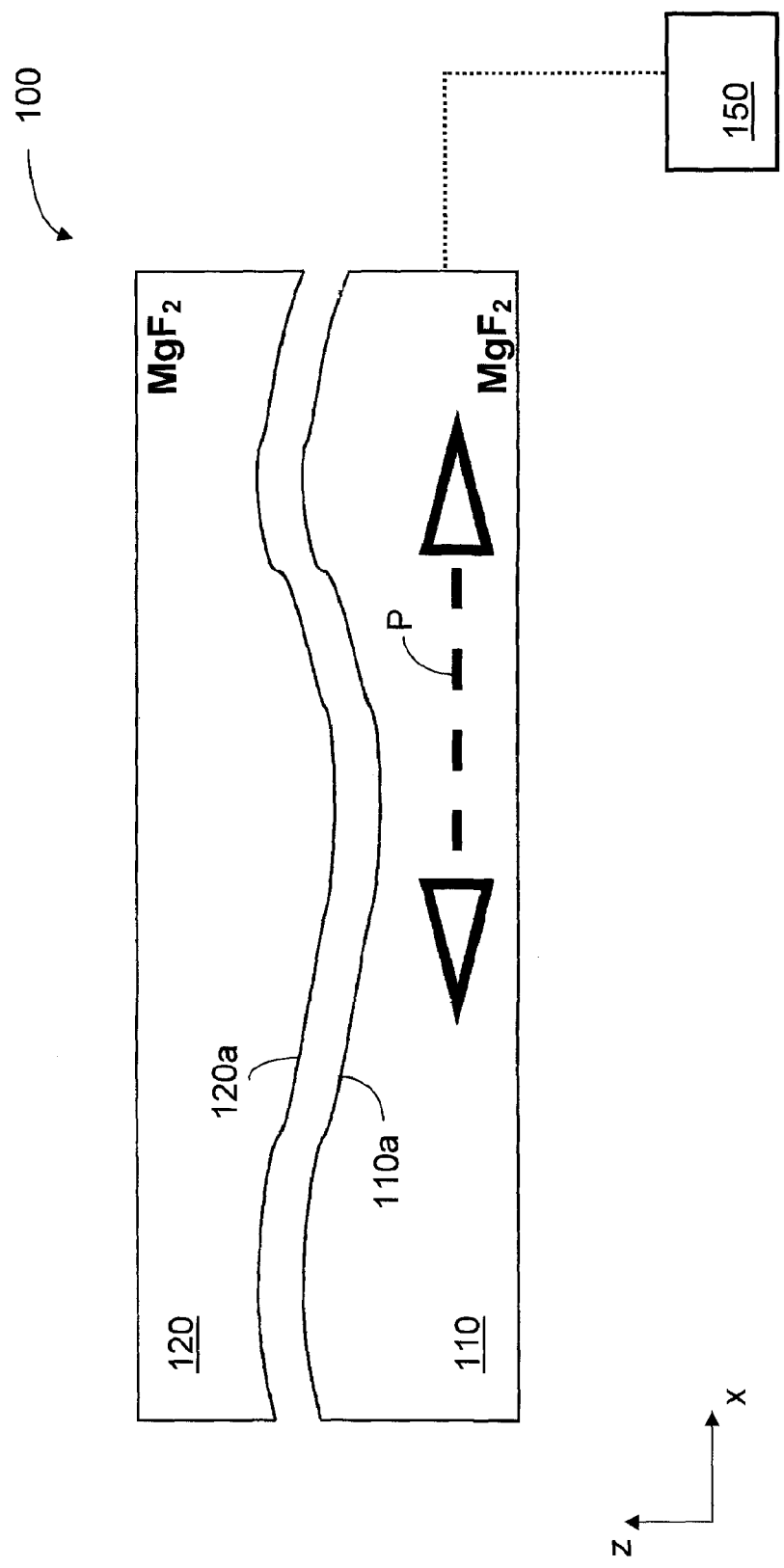
FIG. 1 shows a diagrammatic view of a polarization manipulator in a first exemplary embodiment, shows a diagrammatic view of a polarization manipulator in a further exemplary embodiment.

FIG. 1 shows the structure in principle of a polarization manipulator 100. It has a first subelement 110 and a second subelement 120 which in the illustrated embodiment are each made from magnesium fluoride ($MgF_2$) and have mutually facing aspheric surfaces 110*a* and 120*a* respectively, those aspheric surfaces 110*a* and 120*a* being mutually complementary. As in this exemplary embodiment the other surfaces of the subelements 110 and 120 are each planar surfaces the two subelements 110 and 120 thus supplement each other to afford an overall plane-parallel geometry.

The relative position of the two subelements 110 and 120 of the polarization manipulator 100 is variable, wherein that variation, as shown in FIG. 1, can be implemented in the x-direction in the illustrated coordinate system by way of an only diagrammatically illustrated position manipulator 150. In that respect it is assumed in FIG. 1 that the optical axis of the optical system and the light propagation direction extend in the z-direction so that the relative displacement of the optical elements 110 and 120 here occurs perpendicularly to that optical axis. The disclosure however is not limited thereto, in which respect the change in the relative position of the subelements 110 and 120 can alternatively or additionally also include displacement of at least one of the subelements 110, 120 in a direction along the optical axis (z-direction), rotation of at least one of the subelements 110, 120 about an axis of rotation parallel to the optical axis or rotation of at least one of the subelements 110, 120 about an axis of rotation which is not parallel to the optical axis.

The orientation of the optical crystal axis in the crystal material of the subelements 110 and 120 in the illustrated embodiment extends in each case in the plane perpendicular to the optical axis of the optical system, for example in the y-direction, so that the retardation caused by the respective subelement is proportional to the thickness of that subelement. In that respect the orientation of the optical crystal axis of the first subelement 110 can differ from the orientation of the optical crystal axis of the second subelement 120 by an angle of more than 5°, such as by an angle of more than 10°.

The disclosure is not limited to the configuration of the subelements of a crystal material with linear birefringence as shown in FIG. 1. Rather one or both subelements in alternative embodiments can also be made from an optically active material involving circular birefringence (for example crystalline quartz with orientation of the optical crystal axis parallel to the light propagation direction) and/or a material which causes a change in the polarization state by transmission splitting between orthogonal polarization states, that is to say by a change in the amplitude relationship of orthogonal polarization states in dependence on the orientations thereof. Materials suitable for that purpose are those which, at the working wavelength of for example 193 nm, have natural dichroism (similar to turmalin), for example crystalline quartz, calcite ($CaCO_3$) or $Ba_3(B_3O_6)_2$ (BBO).

Furthermore the possibly linear birefringence in one or both subelements 110, 120 can also be implemented using cubically crystalline material which can be put under compression or tensile stress (for example ($CaF_2$, $BaF_2$, $LiBaF_3$, $Lu_3Al_5O_{12}$, $Y_3Al_5O_{12}$ or $MgAl_2O_4$), by using amorphous material which can be put under compression or tensile stress (for example quartz glass ($SiO_2$)) or by using another optically uniaxial crystalline material than $MgF_2$ (for example $LaF_3$, $Al_2O_3$ or $SiO_2$ with a crystal axis which is not parallel to the light propagation direction).

FIGS. 13a-e diagrammatically show embodiments by way of example of a subelement which can be used in an optical system, wherein the illustrated double-headed arrows respectively indicate the manipulation of the position of the subelement in relation to the optical axis OA of the optical system, which manipulation can be achieved via the position manipulator (not shown in FIGS. 13a through 13e).

Figure 13A:
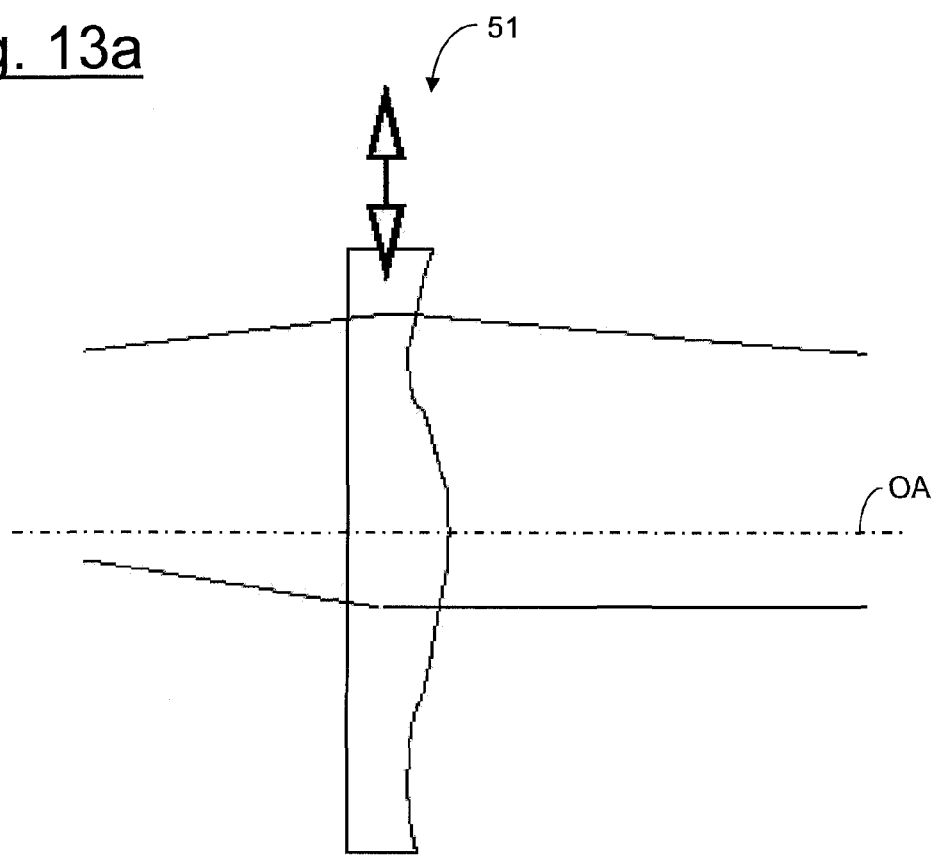
FIGS. 13*a-e* show diagrammatic views of embodiments by way of example of one or more subelements which can be used in an optical system.
Figure 13B:
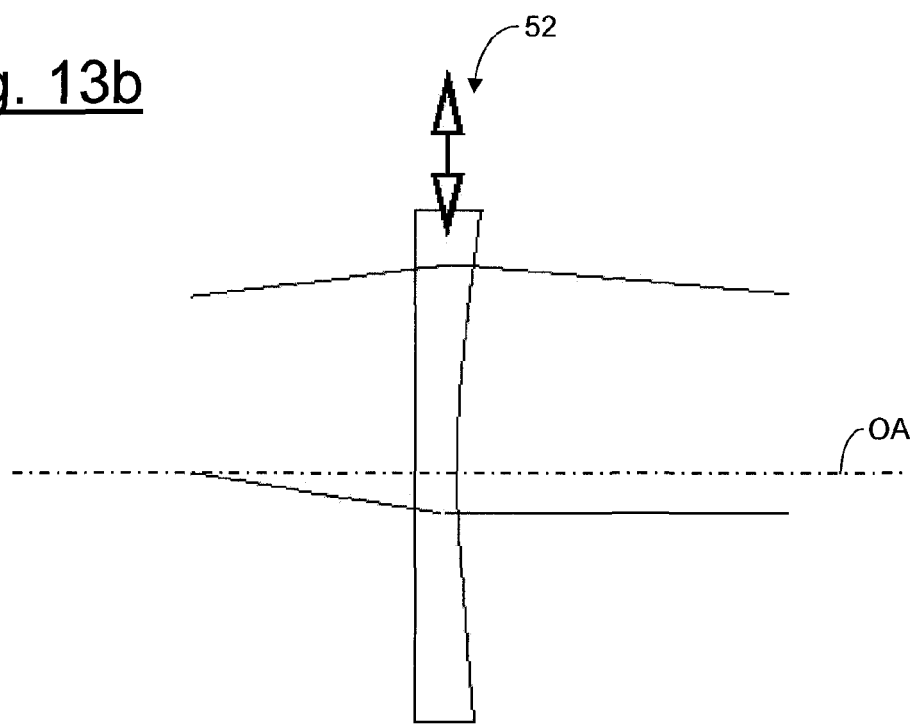
Figure 13C:
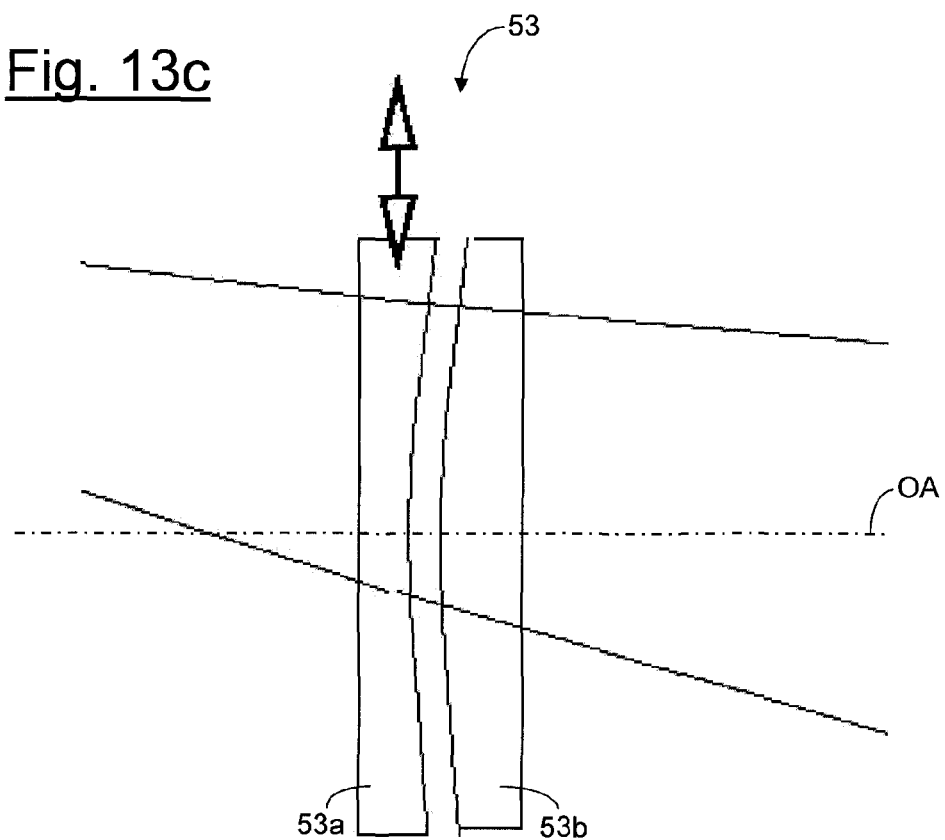
Figure 13D:
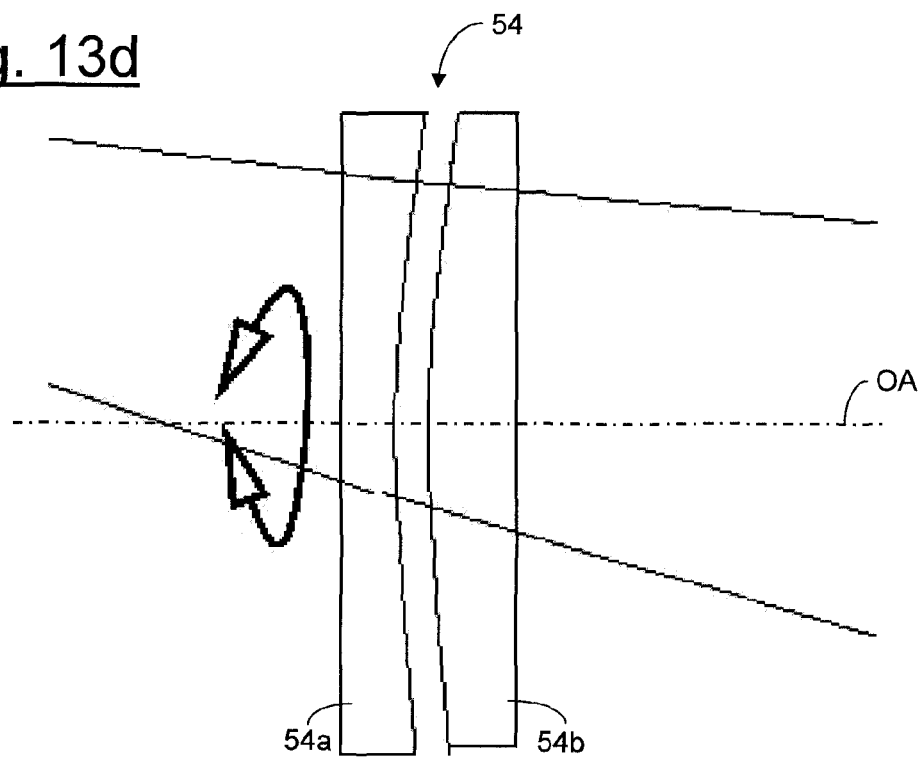

In that respect the subelement can be for example a subelement 51 having an aspheric optical active surface (FIG. 13a). Furthermore the subelement can also be a subelement having a non-planar but spherical optical active surface (FIG. 13b). FIGS. 13c and 13d show arrangements 53 and 54 including two subelements 53a, 53b and 54a, 54b respectively having respectively mutually facing optical active surfaces which are complementary to each other and of a spherical configuration, wherein the change in the relative position of those subelements can be implemented both by displacement (FIG. 13c, in which the displacement is effected only by way of example in a plane perpendicular to the optical axis OA) and also by rotation (FIG. 13d in which the rotation is effected only by way of example about the optical axis OA). In that respect a respective maximum effective retardation introduced by the subelement along the optical axis is less than a quarter of the working wavelength of the optical system.

Figure 13E:
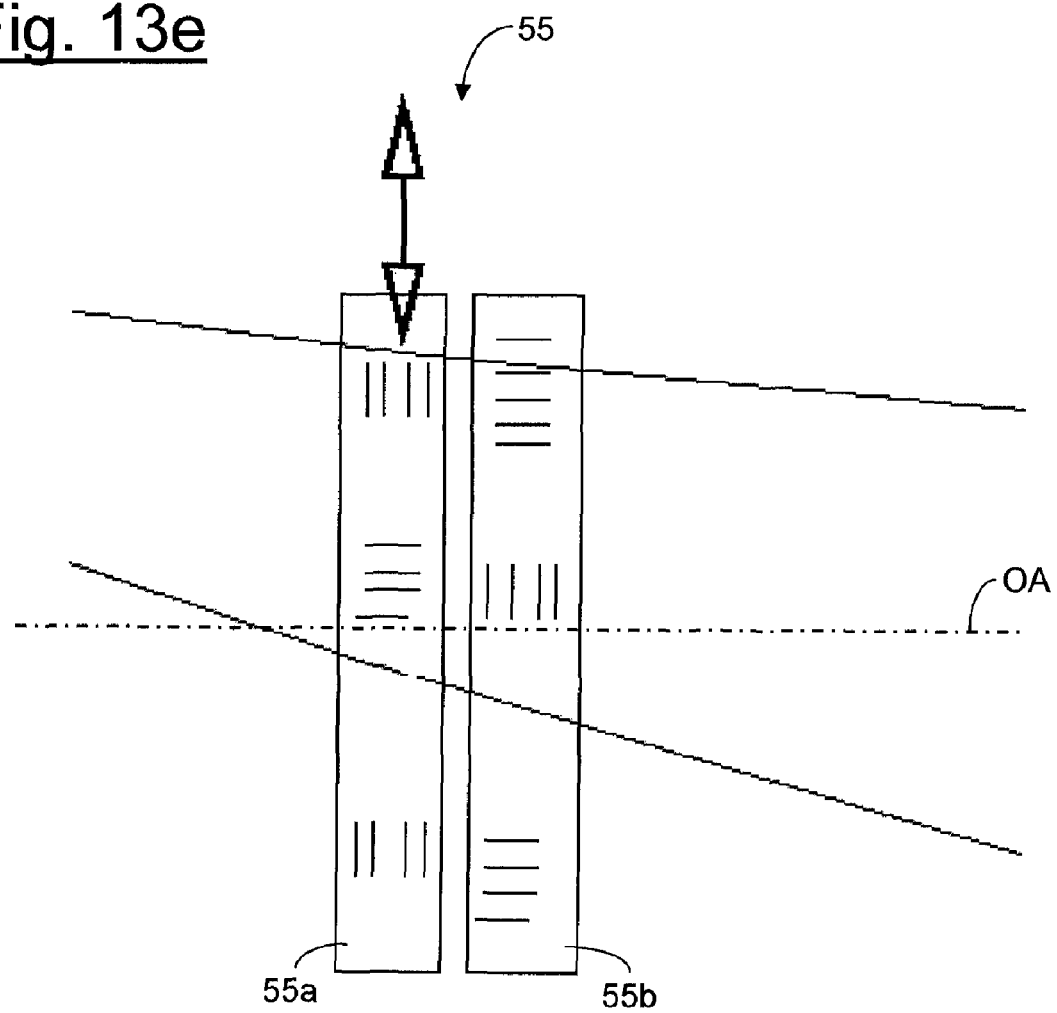

FIG. 13e, in accordance with another also possible approach, shows an arrangement 55 including two subelements 55a and 55b with respect to which the birefringence distribution respectively varies within the subelements in a direction perpendicular to the optical axis OA, wherein that variation is here produced not via a thickness variation of the subelements but via a positional variation of the birefringence (for example a varying stress birefringence).

Figure 2:
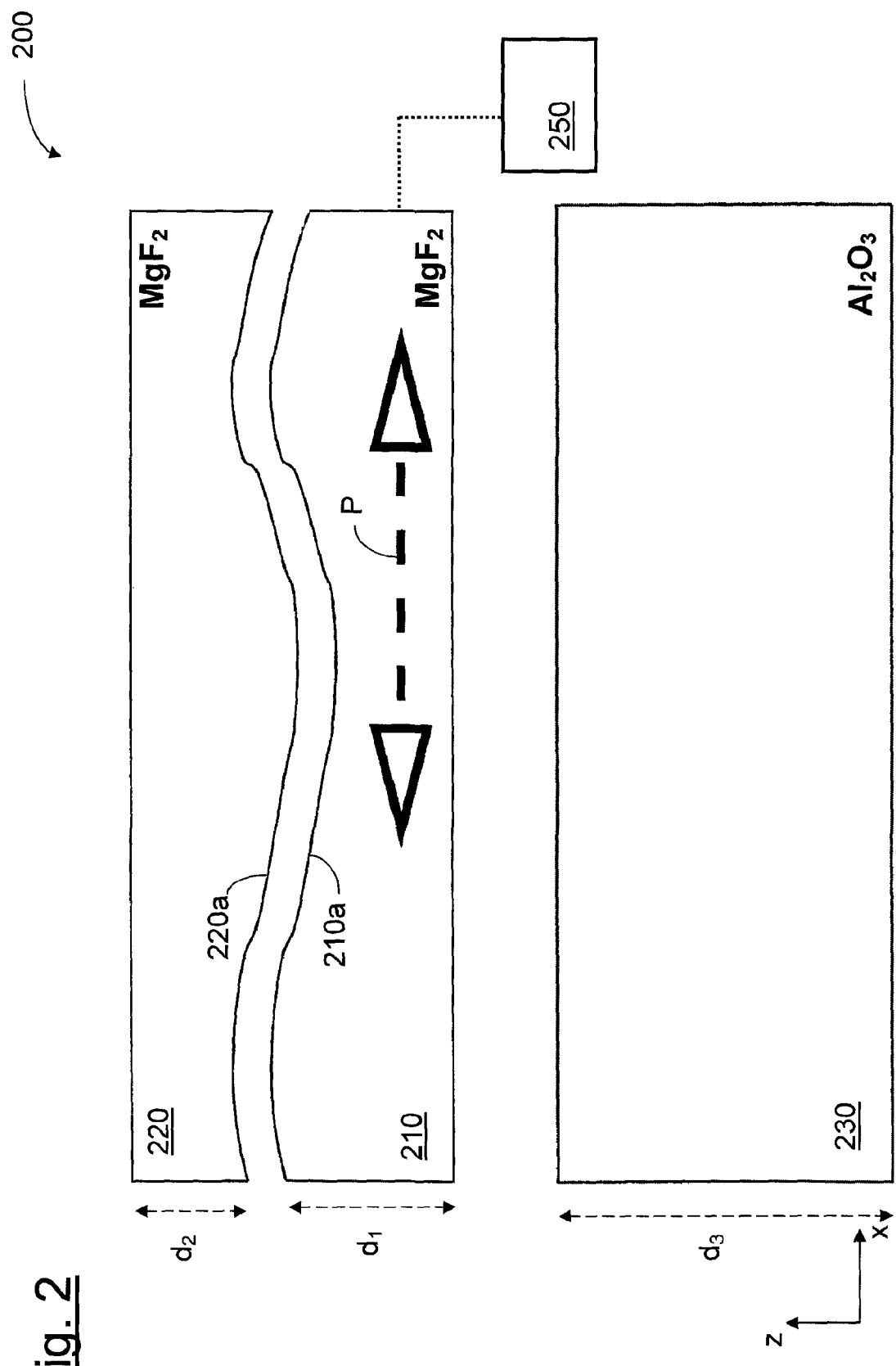

FIG. 2 shows a further exemplary embodiment of a polarization manipulator 200. First, in a structure similar to FIG. 1, this polarization manipulator 200 includes two subelements 210 and 220 which are each made from magnesium fluoride ($MgF_2$) and have mutually facing aspheric and mutually complementary surfaces 210a and 220a respectively, a position manipulator 250 for changing the relative position and in addition a plane plate 230 which is made from sapphire ($Al_2O_3$) and which is arranged with its light entrance and light exit surfaces parallel to the light entrance and light exit surfaces respectively of the subelements 210 and 220. As magnesium fluoride ($MgF_2$) is an optically positive material ($n_e - n_o = 0.0135 > 0$) and sapphire ($Al_2O_3$) is a negatively birefringent material ($n_e - n_o = -0.0133 < 0$), a suitable choice of the (marginal) thicknesses $d_1$, $d_2$ and $d_3$ can provide that, in the starting position shown in FIG. 2 of the polarization manipulator, for light which is propagated in the z-direction, there is not a resulting birefringent effect on the part of the overall arrangement. By way of example it is possible for that purpose to select the thicknesses $d_1 = d_2 = 2.5$ mm and $d_3 = 5.973$ mm. Then, as described hereinafter, polarization influencing can be adjusted in the desired fashion by way of a variation in the relative position of the two subelements.

In terms of the specific configuration of the aspheric surfaces 210a and 220a, the positional dependency of which is described by a function T(x,y) referred to hereinafter as the separation asphere, the basic starting point adopted hereinafter is a predetermined disturbance to be compensated in the optical system or a suitably selected thickness profile in the magnesium fluoride material, wherein the last-mentioned thickness profile can be described by a thickness function D(x,y). The aforementioned separation sphere T(x,y) is then given by the antiderivative or the integral of the desired thickness function D(x,y), that is to say the following applies:

$$T(x, y) = \int_0^x D(x', y) dx' \qquad (2)$$

The amplitude of the retardation afforded by the polarization manipulator 100 or 200 respectively is now proportional to the relative displacement of the subelements 110, 120 and 210, 220 respectively and proportional to the amplitude of the separation asphere T(x,y).

Figure 3A:
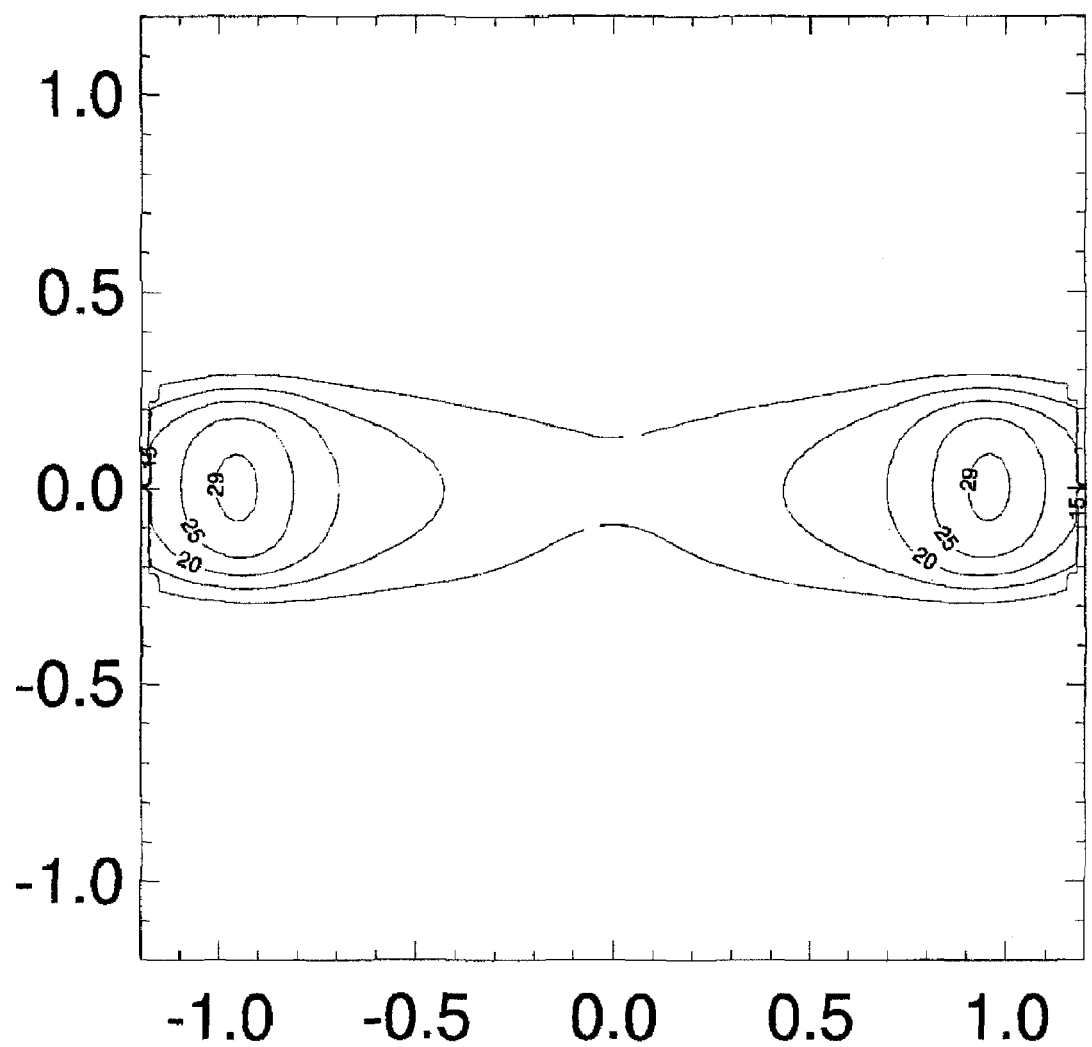
FIGS. 3*a-b* show a distribution by way of example of a retardation to be compensated (in nm) by virtue of polarization-induced birefringence and the associated orientation of the fast axis of the birefringence (FIG. 3*b*)
Figure 3B:
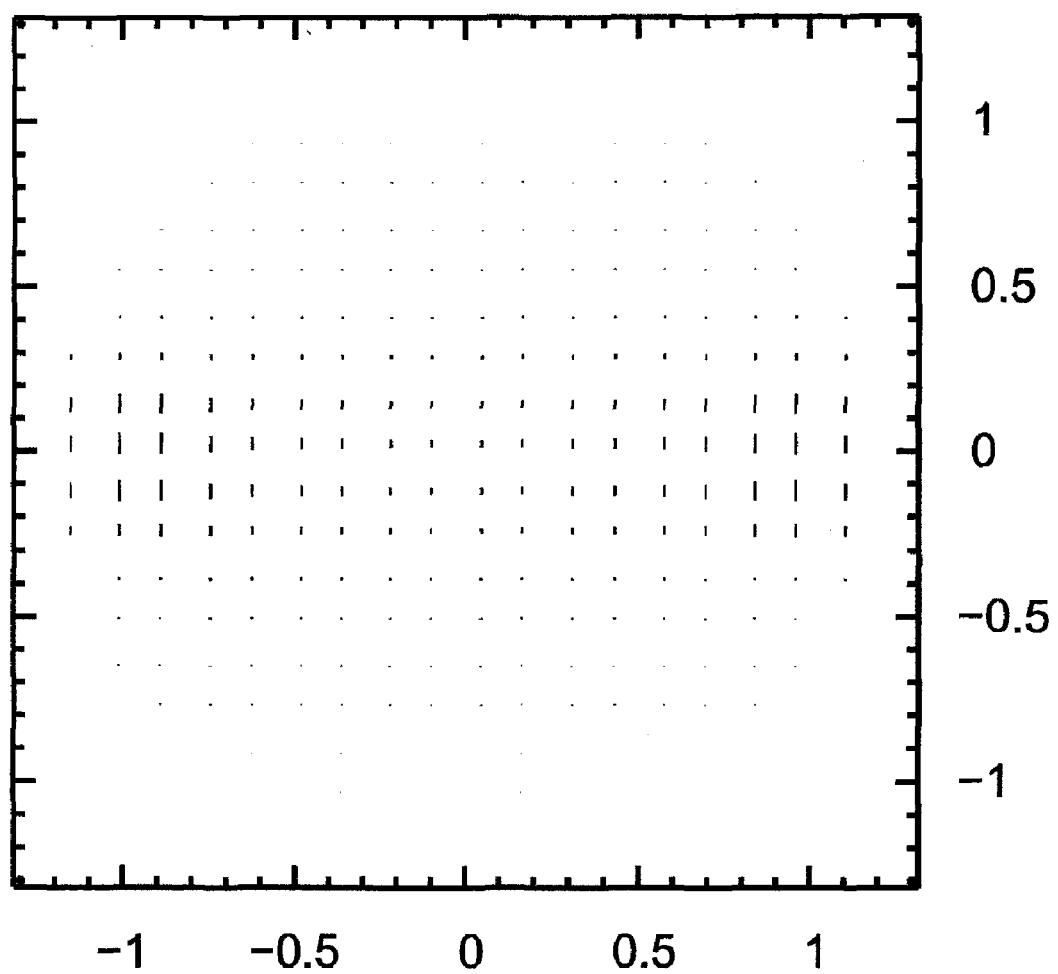
Figure 4:
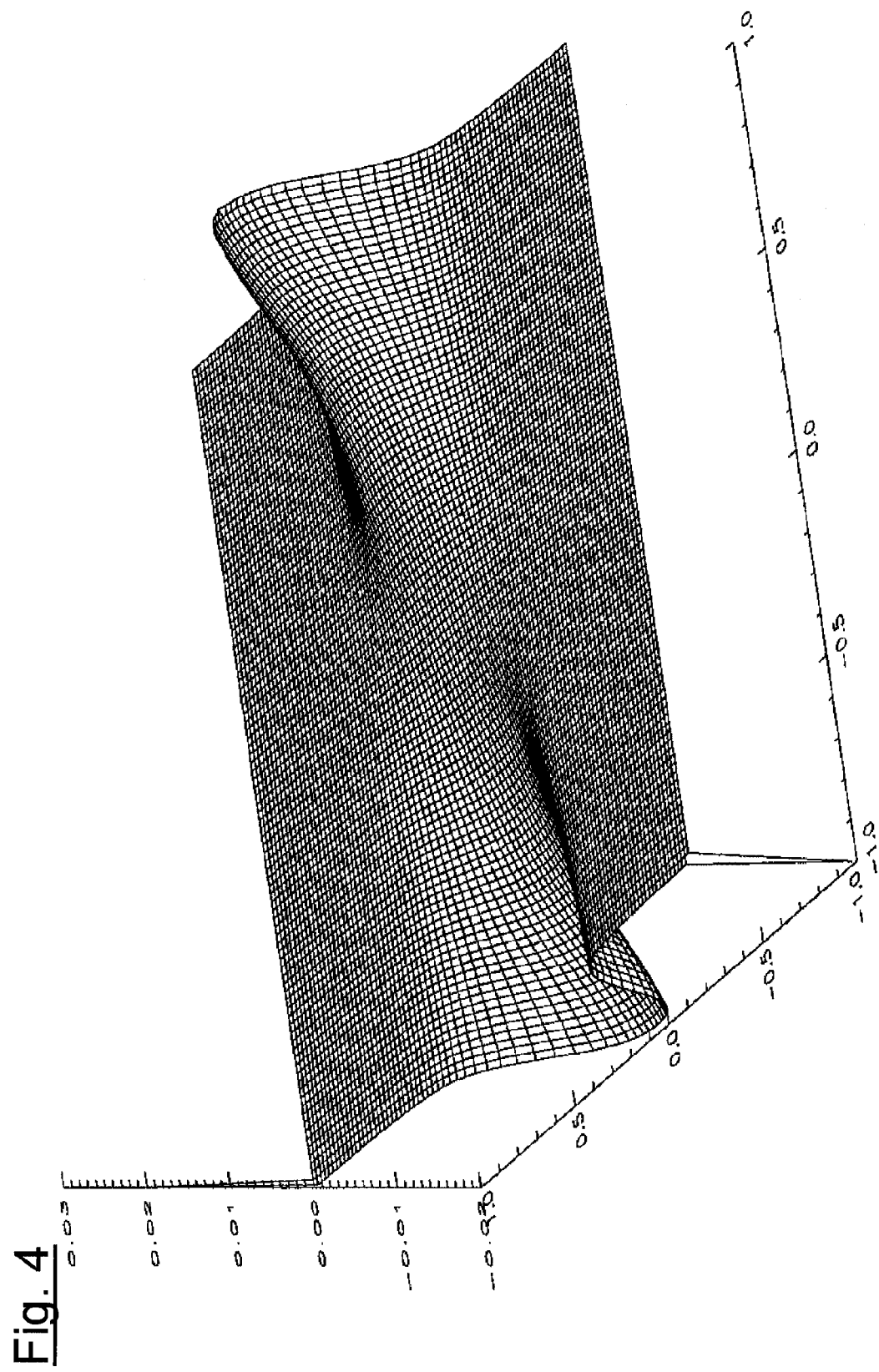
FIG. 4 shows a configuration, suitable for compensation of the retardation distribution in FIG. 3*a*, with respect to the amplitude of the separation asphere in the polarization manipulator of FIG. 2, FIGS. 5*a-b* show the distribution of the respective orientations of the fast axis of the birefringence for a predetermined disturbance to be compensated (FIG. 5*a*) and for the polarization manipulator as shown in FIG. 2 (FIG. 5*b*)
Figure 5A:
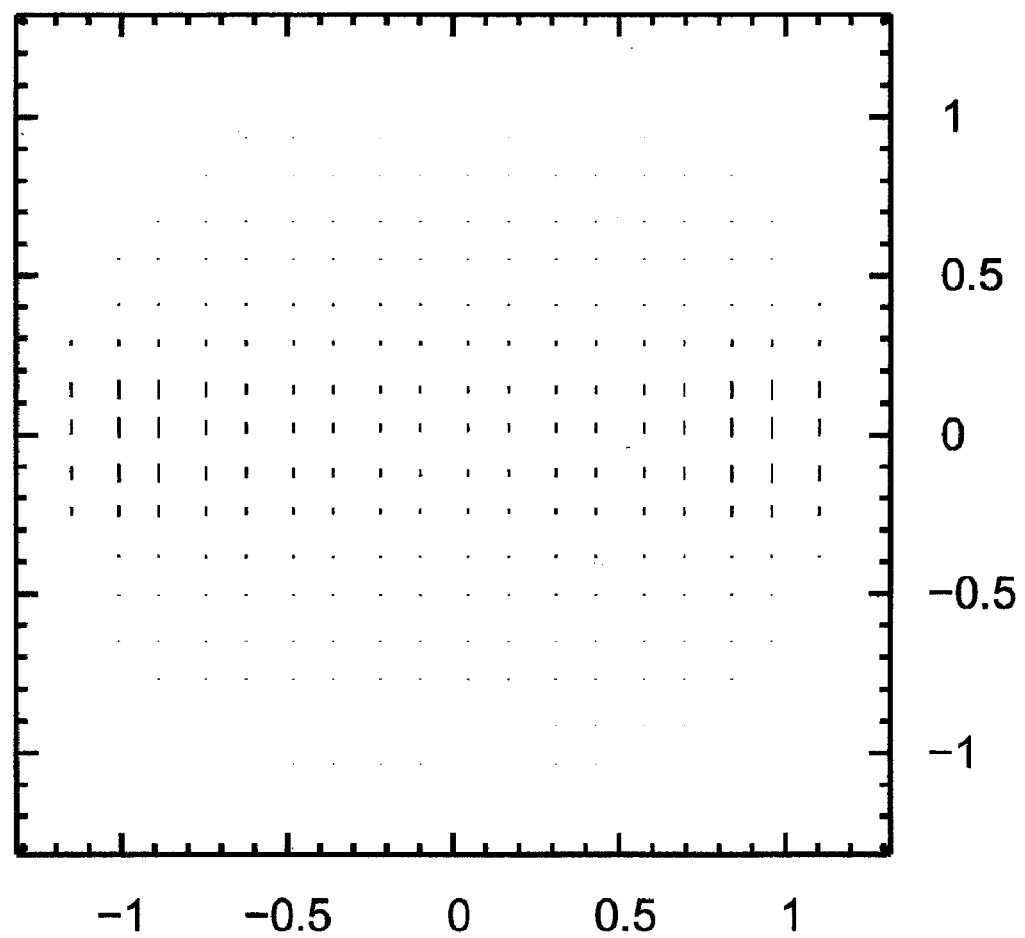
Figure 5B:
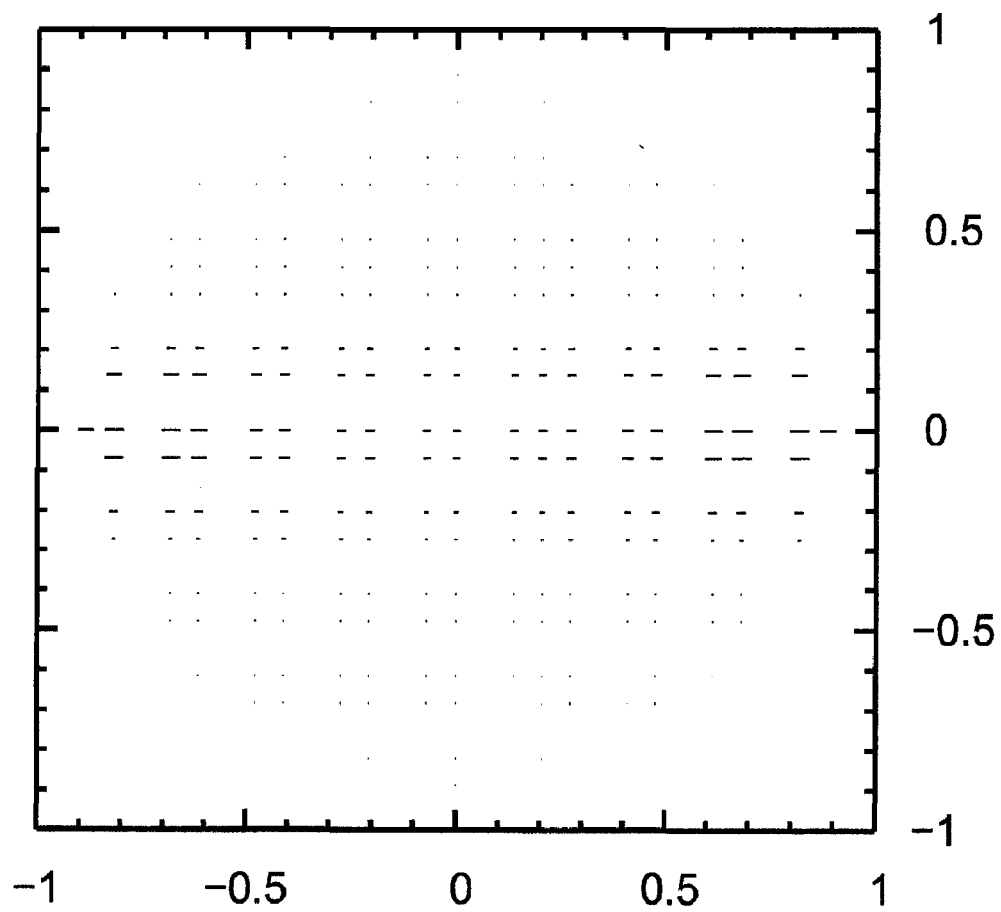

FIG. 3a shows the example of a retardation distribution (in nm) to be compensated, which is caused by polarization-induced birefringence in the optical system, wherein respectively standardized pupil coordinates are plotted on the axes of the diagram and also in the further diagrams in FIG. 3b and FIGS. 5a-b. FIG. 3b shows the associated orientation of the fast axis of that birefringence. FIG. 4 shows a variation, which is suitable in accordance with equation (2) for compensation of the disturbance of FIG. 3a, in the amplitude of the separation asphere T(x,y) in the polarization manipulator of FIG. 2. As can be seen from a comparison of FIGS. 5a and 5b the respective orientations of the fast axis of the birefringence for a predetermined disturbance to be compensated (FIG. 5a) and for the polarization manipulator (FIG. 5b) are mutually perpendicular.

The concrete calculation shows that, for the relative displacements of the two subelements 210 and 220 of up to 250 μm, the maximum amplitude of the separation asphere T(x,y) is at about ±193 μm to afford a retardation of about 10 nm.

Figure 6:
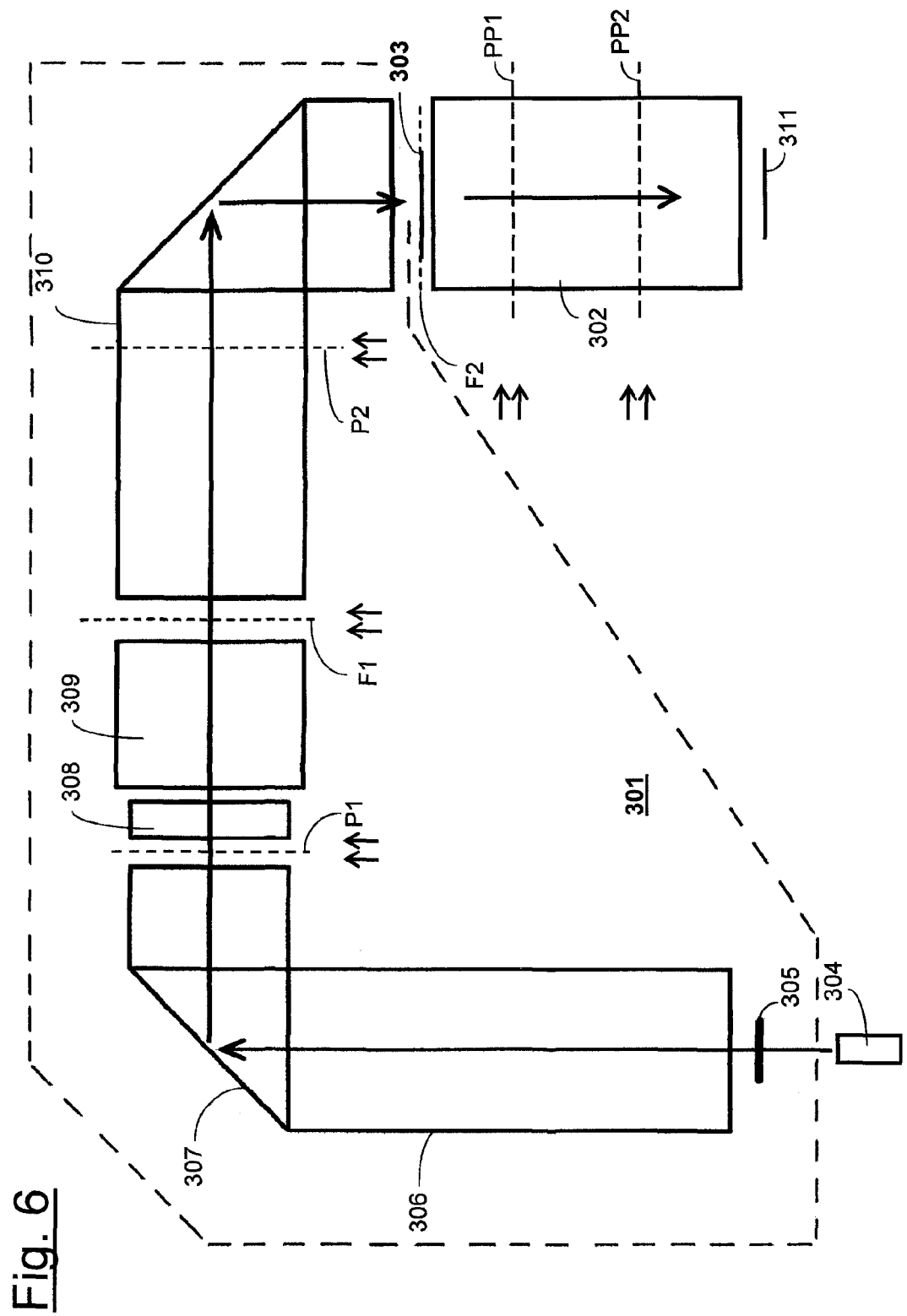
FIG. 6 shows a structure in principle by way of example of a microlithographic projection exposure apparatus.

FIG. 6 is an only diagrammatic view to illustrate the structure in principle of a microlithographic projection exposure apparatus in accordance with an exemplary embodiment. In this case the concept of the disclosure can be applied equally both in the illumination system and also in the projection objective. Positions by way of example, which are suitable for the arrangement of polarization manipulators (namely positions near the pupil, near the image or near the intermediate image, or intermediate positions) are only diagrammatically indicated by arrows in FIG. 6.

The microlithographic projection exposure apparatus has an illumination system 301 and a projection objective 302. The illumination system 301 serves for the illumination of a structure-bearing mask (reticle) 303 with light from a light source unit 304 which for example includes an ArF laser for a working wavelength of 193 nm and a beam-shaping optical device for producing a parallel light beam. The parallel light beam from the light source unit 304 is firstly incident on a diffractive optical element 305 which produces a desired intensity distribution (for example dipole or quadrupole distribution) in a pupil plane P1 by way of an angle beam radiation characteristic defined by the respective diffractive surface structure. Disposed downstream of the diffractive optical element 305 in the light propagation direction is an optical unit 306 having a zoom objective for producing a parallel light beam of variable diameter and an axicon lens. Different illumination configurations are produced in the pupil plane P1 depending on the respective zoom setting and position of the axicon elements, via the zoom objective in conjunction with the upstream-disposed diffractive optical element 305. The optical unit 306 in the illustrated embodiment further includes a deflection mirror 307. Disposed downstream of the pupil plane P1 in the beam path in the light propagation direction is a light mixing device 308 which for example in per se known manner can have an arrangement of microoptical elements, that is suitable for achieving a light mixing effect. The light mixing device 308 is followed in the light propagation direction by a lens group 309, downstream of which is disposed a field plane F1 with a reticle masking system (REMA) which is projected by an REMA objective 310 that follows in the light propagation direction onto the structure-bearing mask (reticle) 303 in the field plane F2, and thereby delimits the illuminated region on the reticle. The structure-bearing mask 303 is now projected onto a substrate 311 or wafer provided with a light-sensitive layer with the projection objective 302 which in the illustrated example has two pupil planes PP1 and PP2.

In addition FIGS. 7 through 12 show specific designs by way of example of projection objectives in which one or more polarization manipulators can be arranged as described hereinbefore.

Figure 7:
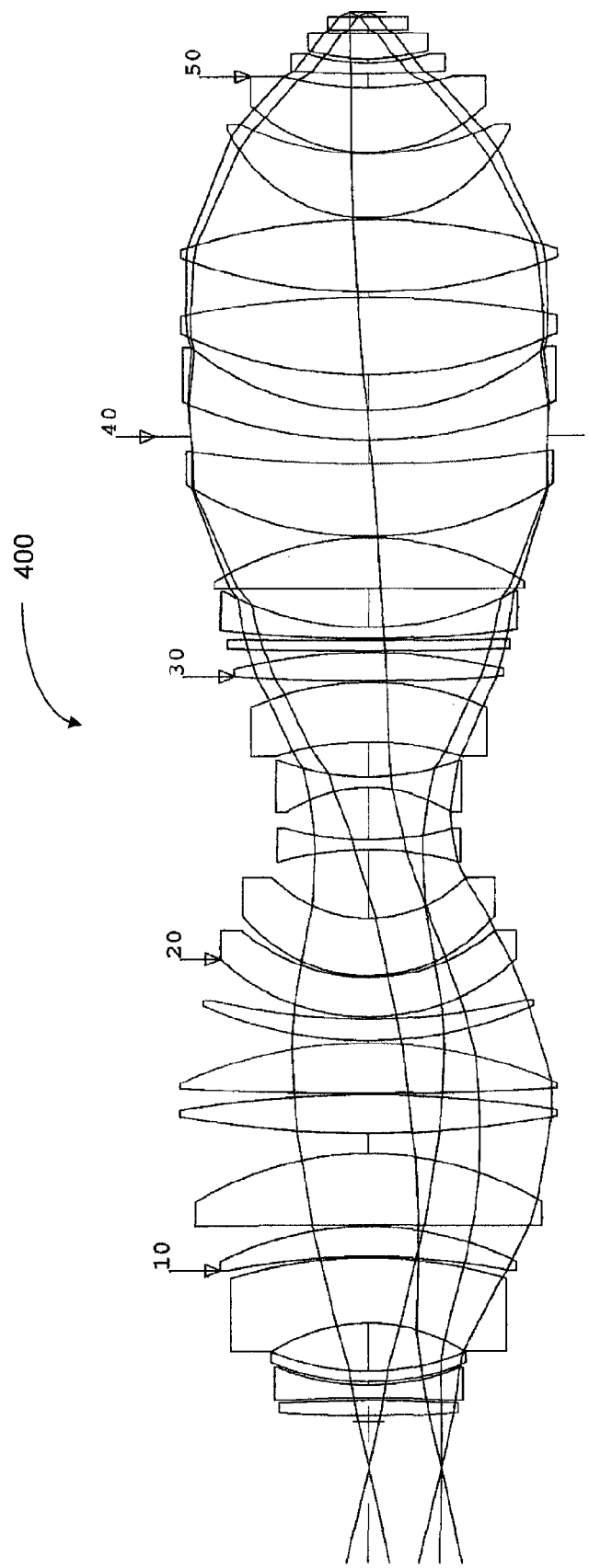
FIGS. 7-12 show by way of example embodiments of projection objectives in meridional section.
Figure 8:
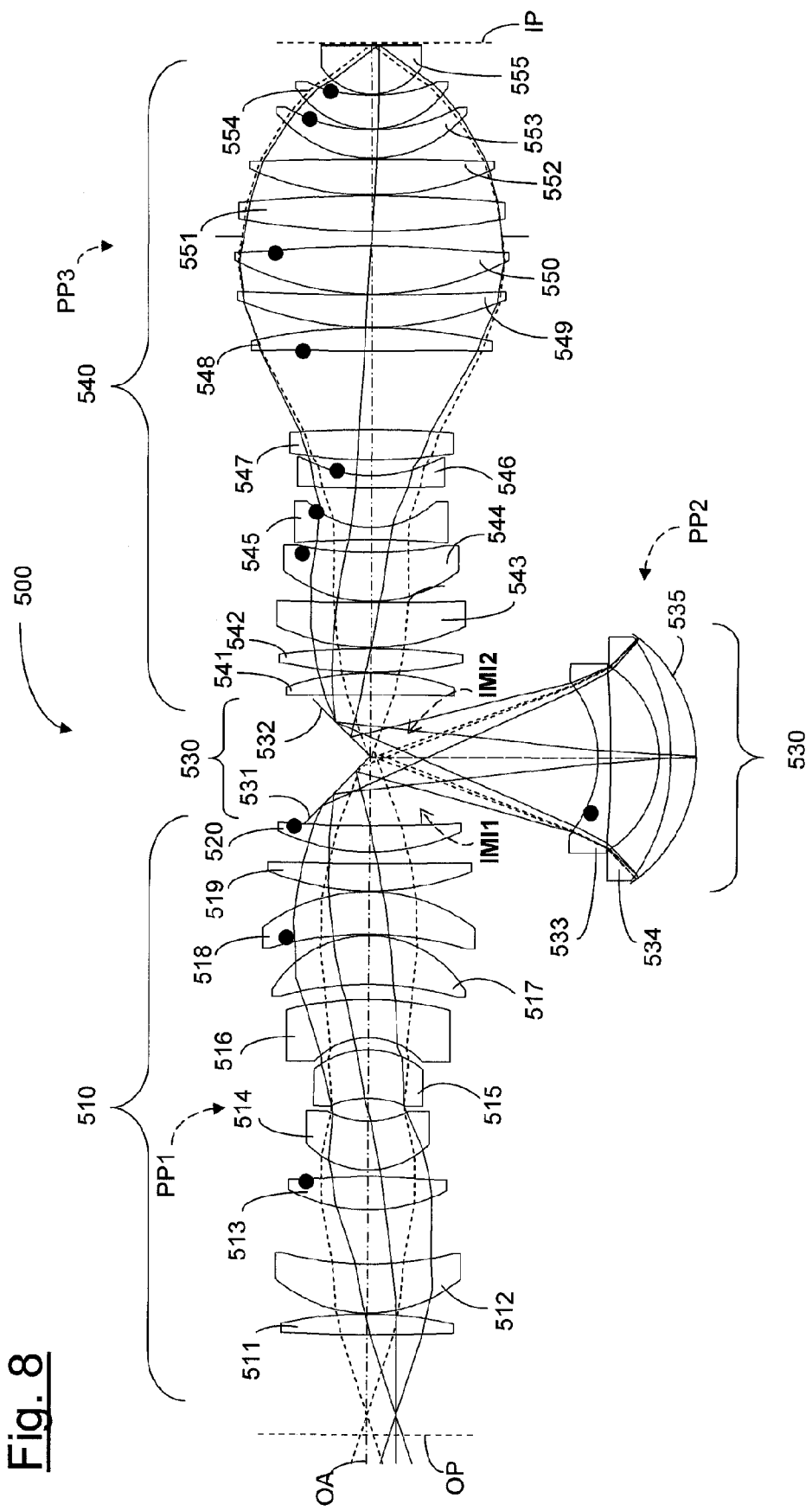

FIG. 7 shows a projection objective 400 in meridional section, which is disclosed in WO 2003/075096 A2 (see therein FIG. 8 and Table 8). The projection objective 400 is of a purely refractive structure with a waist and a first positive lens group, a second negative lens group and a third positive lens group.

FIG. 8 shows a projection objective 500 in meridional section, which is disclosed in WO 2004/019128 A2 (see therein FIG. 19 and Tables 9 and 10). The projection objective 500 includes a first refractive subsystem 510, a second catadioptric subsystem 530 and a third refractive subsystem 540 and is therefore also referred to as an "RCR system". In that respect the term "subsystem" is always used to denote such an arrangement of optical elements, by which a real object is imaged as a real image or intermediate image. In other words, each subsystem, starting from a given object or intermediate image plane, always includes all optical elements to the next real image or intermediate image.

The first refractive subsystem 510 includes refractive lenses 511 through 520, after which a first intermediate image IMI1 is produced in the beam path. The second subsystem 530 includes a double-fold mirror with two mirror surfaces 531 and 532 arranged at an angle relative to each other, wherein light incident from the first subsystem 510 is firstly reflected at the mirror surface 531 in the direction towards the lenses 533 and 534 and a subsequent concave mirror 535. The concave mirror 535 in per se known manner permits effective compensation of the image field curvature produced by the subsystems 510 and 540. The light reflected at the concave mirror 535 is reflected after again passing through the lenses 534 and 533 at the second mirror surface 532 of the double-fold mirror so that as a result of the optical axis OA is folded twice through 90°. The second subsystem 530 produces a second intermediate image IMI2 and the light therefrom is incident on the third refractive subsystem 540 including refractive lenses 541 through 555. The second intermediate image IMI2 is projected onto the image plane IP by the third refractive subsystem 540.

Figure 9:
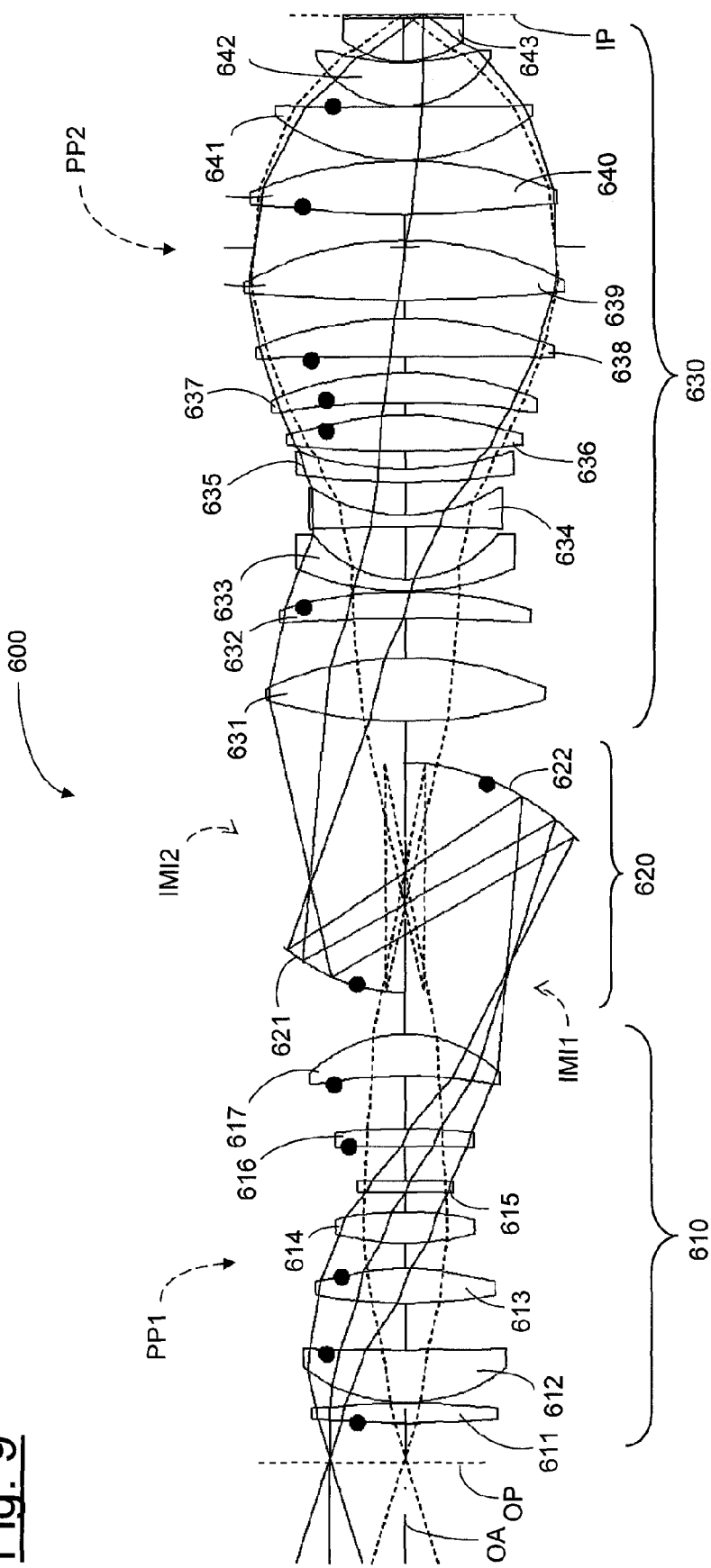

Referring to FIG. 9 shown therein is a projection objective 600 in meridional section, which is disclosed in WO 2005/069055 A2 (see therein FIG. 32). The design data of that projection objective 400 are set out in Table 1. In that respect column 1 gives the number of the respective refractive or otherwise distinguished optical surface, column 2 gives the radius of that surface (in mm), column 3 optionally includes a reference to an asphere at that surface, column 4 gives the spacing, identified as thickness, of that surface relative to the following surface (in mm), column 5 gives the material following the respective surface and column 6 gives the optically useable free half diameter (in mm) of the optical component.

The aspheric constants are to be found in Table 2. The surfaces identified by thick dots in FIG. 9 and specified in Tables 1 and 2 are aspherically curved, the curvature of those surfaces being given by the following asphere formula:

$$P(h) = \frac{(1/r) \cdot h^2}{1 + \sqrt{1 - (1+cc)(1/r)^2 h^2}} + C_1 h^4 + C_2 h^6 + \ldots \quad (3)$$

Therein P denotes the camber height of the surface in question parallel to the optical axis, h denotes the radial spacing from the optical axis, r denotes the radius of curvature of the surface in question, cc denotes the conical constant (identified by K in Table 7) and $C_1, C_2, \ldots$ denote the asphere constants set forth in Table 2.

Referring to FIG. 9 the projection objective 600 in a catadioptric structure has a first optical subsystem 610, a second optical subsystem 620 and a third optical subsystem 630. The first optical subsystem 610 includes an arrangement of refractive lenses 611 through 617 and projects the object plane "OP" into a first intermediate image IMI1, the approximate position of which is indicated by an arrow in FIG. 9. That first intermediate image IMI1 is projected through the second optical subsystem 620 into a second intermediate image IMI2, the approximate position of which is also indicated by an arrow in FIG. 9. The second optical subsystem 620 includes a first concave mirror 621 and a second concave mirror 622 which are each "cut off" in a direction perpendicular to the optical axis, in such a way that light propagation can respectively occur from the reflecting surfaces of the concave mirrors 621, 622 to the image plane IP. The second intermediate image IMI2 is projected into the image plane IP by the third optical subsystem 630. The third optical subsystem 630 includes an arrangement of refractive lenses 631 through 643.

Figure 10:
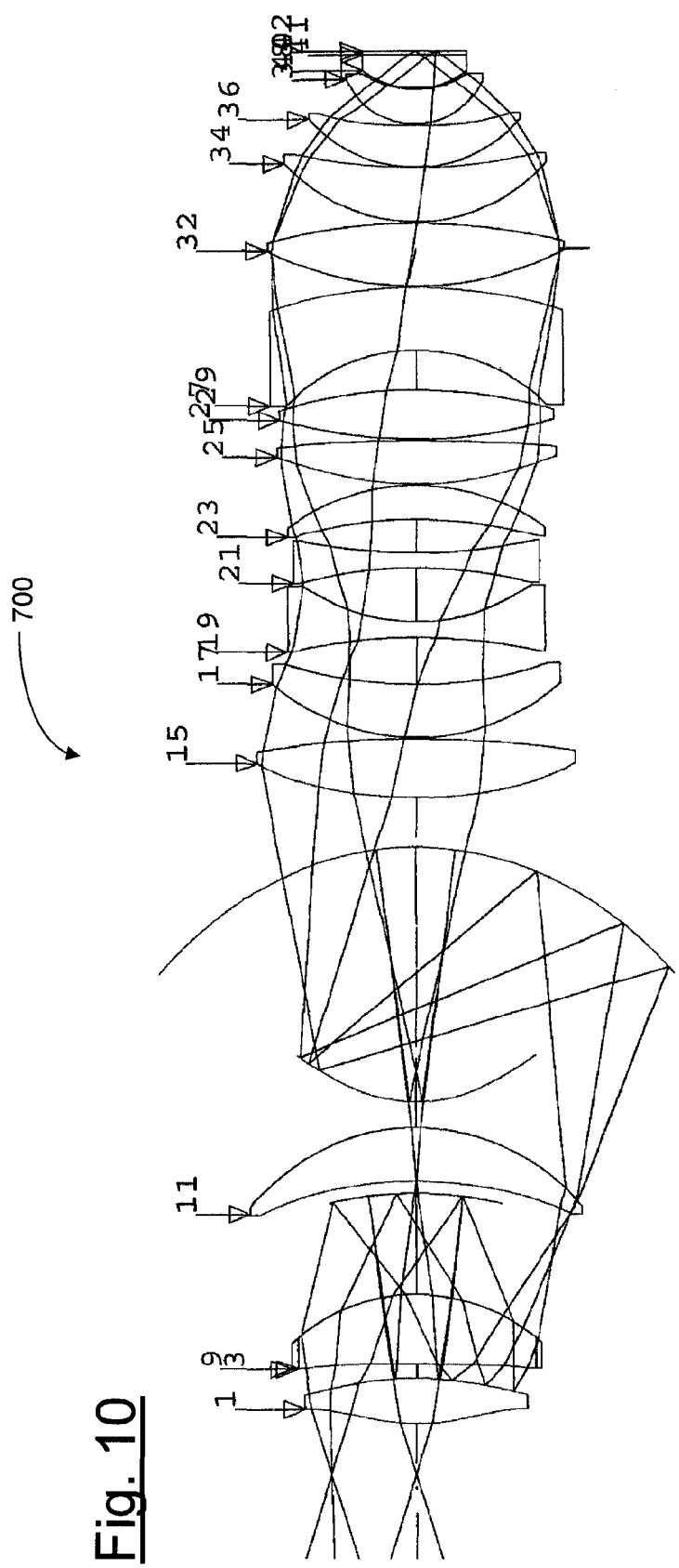
Figure 11:
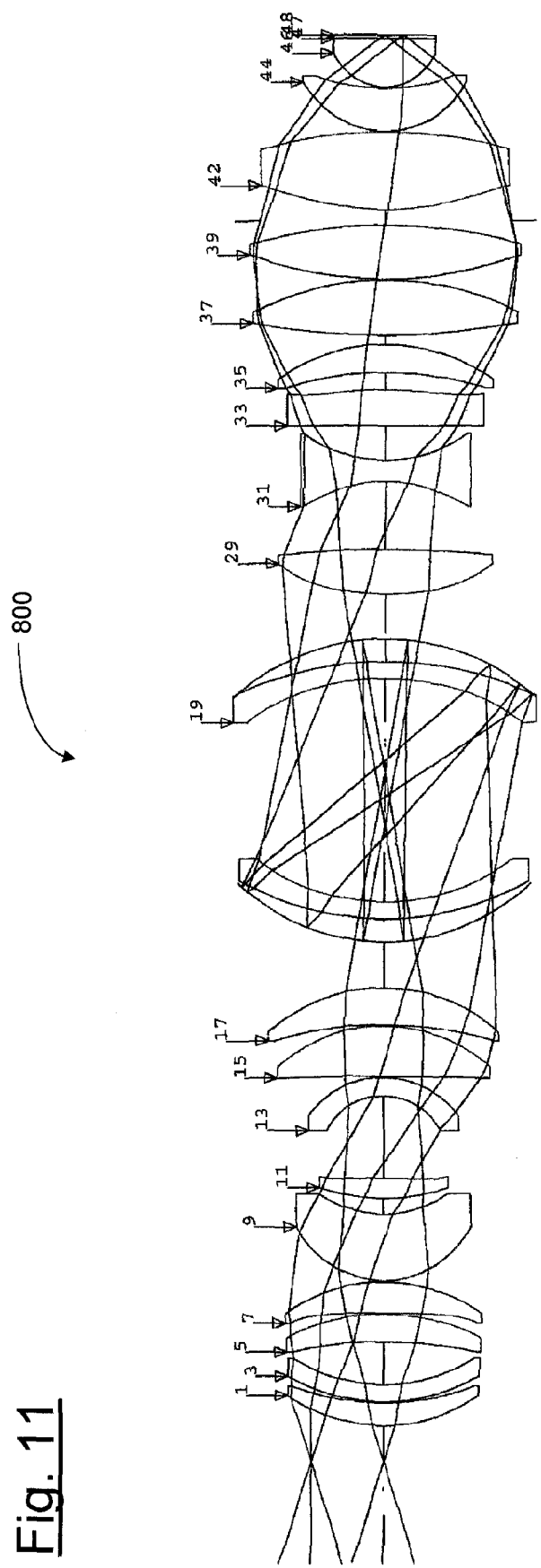
Figure 12:
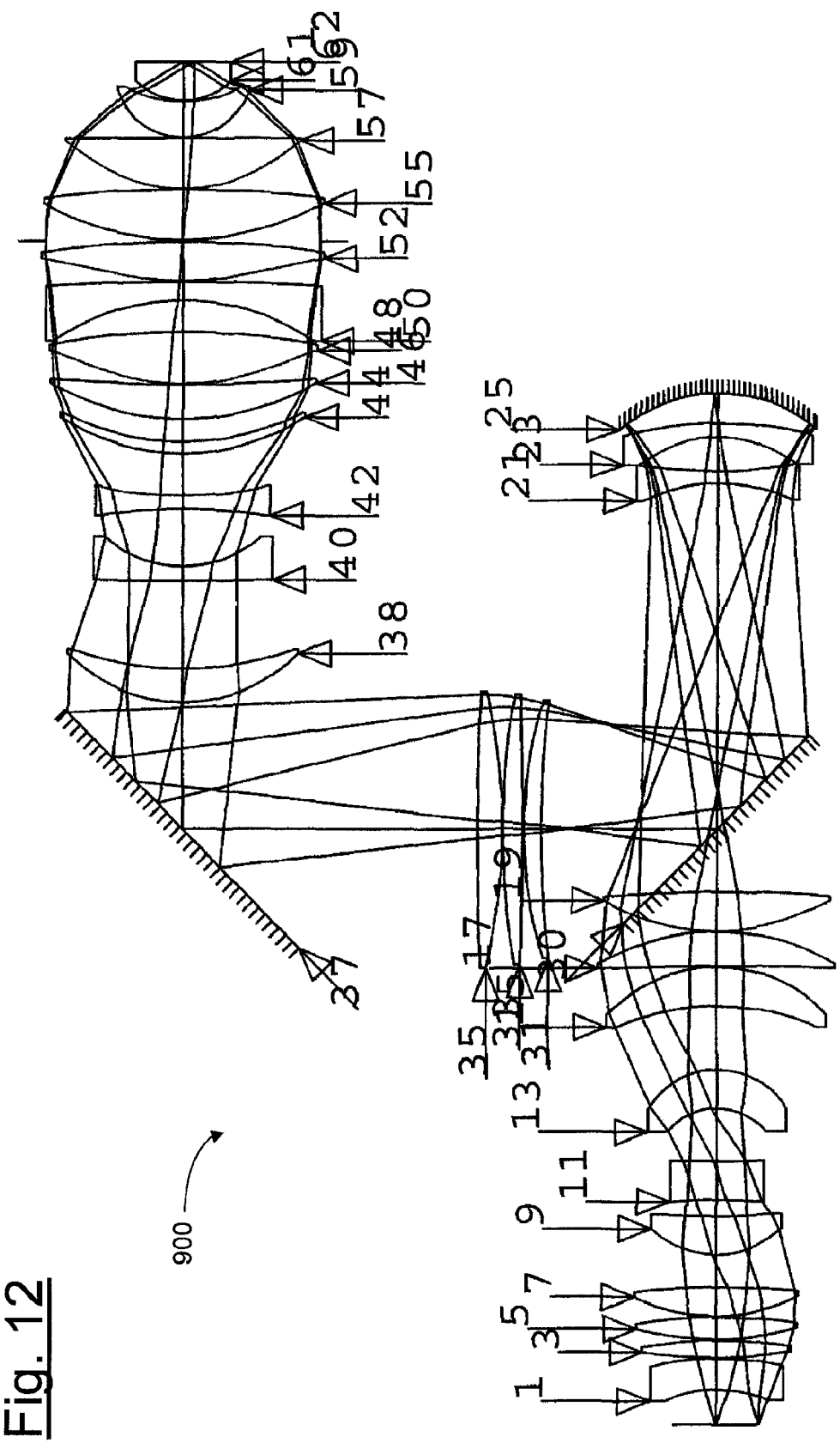

Referring to FIG. 10 shown therein is a further catadioptric projection objective 700 in meridional section, which is disclosed in WO 2005/069055 A2 (see therein FIG. 39 and Tables 39, 39A) and which has a total of four mirrors. Referring to FIG. 11 shown therein is a further catadioptric projection objective 800 in meridional section, which is disclosed in WO 2005/069055 A2 (see therein FIG. 21 and Tables 21, 21A) and which has two mirrors with lenses disposed therebetween. Referring to FIG. 12 shown therein is a further catadioptric projection objective 900 in meridional section which is disclosed in EP 1 480 065 A2 (see therein FIG. 19) and which has telecentric deflection mirrors, such telecentry being afforded by a positive group between those deflection mirrors. Further designs for catadioptric projection objectives with an intermediate image are disclosed for example in U.S. Pat. No. 6,665,126 B2.

Even if the disclosure has been described by reference to specific embodiments numerous variations and alternative embodiments will be apparent to the man skilled in the art, for example by combination and/or exchange of features of individual components. Accordingly it will be apparent to the man skilled in the art that such variations and alternative embodiments are also embraced by the present disclosure and the scope of the disclosure is limited only in the sense of the accompanying claims and equivalents thereof.

TABLE 1

(DESIGN DATA FOR FIG. 9):

| Surface | Radius | Asphere | Thickness | Material | Half diameter |
|---|---|---|---|---|---|
| 1 | 0.000000 |  | −0.011620 | LV193975 | 75.462 |
| 2 | 585.070331 | AS | 17.118596 | SIO2V | 76.447 |
| 3 | −766.901651 |  | 0.890161 | HEV19397 | 78.252 |
| 4 | 145.560665 |  | 45.675278 | SIO2V | 85.645 |
| 5 | 2818.543789 | AS | 40.269525 | HEV19397 | 83.237 |
| 6 | 469.396236 |  | 29.972759 | SIO2V | 75.894 |
| 7 | −193.297708 | AS | 21.997025 | HEV19397 | 73.717 |
| 8 | 222.509238 |  | 27.666963 | SIO2V | 57.818 |
| 9 | −274.231957 |  | 31.483375 | HEV19397 | 52.595 |
| 10 | 0.000000 |  | 10.117766 | SIO2V | 44.115 |
| 11 | 0.000000 |  | 15.361487 | HEV19397 | 47.050 |
| 12 | 26971.109897 | AS | 14.803554 | SIO2V | 54.127 |
| 13 | −562.070426 |  | 45.416373 | HEV19397 | 58.058 |
| 14 | −510.104298 | AS | 35.926312 | SIO2V | 76.585 |
| 15 | −118.683707 |  | 36.432152 | HEV19397 | 80.636 |
| 16 | 0.000000 |  | 199.241665 | HEV19397 | 86.561 |
| 17 | −181.080772 | AS | −199.241665 | REFL | 147.684 |
| 18 | 153.434246 | AS | 199.241665 | REFL | 102.596 |
| 19 | 0.000000 |  | 36.432584 | HEV19397 | 105.850 |
| 20 | 408.244008 |  | 54.279598 | SIO2V | 118.053 |
| 21 | −296.362521 |  | 34.669451 | HEV19397 | 118.398 |
| 22 | −1378.452784 |  | 22.782283 | SIO2V | 106.566 |
| 23 | −533.252331 | AS | 0.892985 | HEV19397 | 105.292 |
| 24 | 247.380841 |  | 9.992727 | SIO2V | 92.481 |
| 25 | 103.088603 |  | 45.957039 | HEV19397 | 80.536 |
| 26 | −1832.351074 |  | 9.992069 | SIO2V | 80.563 |
| 27 | 151.452362 |  | 28.883857 | HEV19397 | 81.238 |
| 28 | 693.739003 |  | 11.559320 | SIO2V | 86.714 |
| 29 | 303.301679 |  | 15.104783 | HEV19397 | 91.779 |
| 30 | 1016.426625 |  | 30.905849 | S1O2V | 95.900 |
| 31 | −258.080954 | AS | 10.647394 | HEV19397 | 99.790 |
| 32 | −1386.614747 | AS | 24.903261 | SIO2V | 108.140 |
| 33 | −305.810572 |  | 14.249112 | HEV19397 | 112.465 |
| 34 | −11755.656826 | AS | 32.472684 | SIO2V | 124.075 |
| 35 | −359.229865 |  | 16.650084 | HEV19397 | 126.831 |
| 36 | 1581.896158 |  | 51.095339 | SIO2V | 135.151 |
| 37 | −290.829022 |  | −5.686977 | HEV19397 | 136.116 |
| 38 | 0.000000 |  | 0.000000 | HEV19397 | 131.224 |
| 39 | 0.000000 |  | 28.354383 | HEV19397 | 131.224 |
| 40 | 524.037274 | AS | 45.835992 | SIO2V | 130.144 |
| 41 | −348.286331 |  | 0.878010 | HEV19397 | 129.553 |
| 42 | 184.730622 |  | 45.614622 | SIO2V | 108.838 |
| 43 | 2501.302312 | AS | 0.854125 | HEV19397 | 103.388 |
| 44 | 89.832394 |  | 38.416586 | SIO2V | 73.676 |
| 45 | 209.429378 |  | 0.697559 | HEV19397 | 63.921 |
| 46 | 83.525032 |  | 37.916651 | CAF2V193 | 50.040 |
| 47 | 0.000000 |  | 0.300000 | SIO2V | 21.480 |
| 48 | 0.000000 |  | 0.000000 | SIO2V | 21.116 |
| 49 | 0.000000 |  | 3.000000 | H2OV193B | 21.116 |
| 50 | 0.000000 |  | 0.000000 | AIR | 16.500 |

TABLE 2

(ASPHERIC CONSTANTS FOR FIG. 9):

|  | 2 | 5 | 7 | 12 | 14 |
|---|---|---|---|---|---|
| K | 0 | 0 | 0 | 0 | 0 |
| C1 | −5.72E−02 | −4.71E−02 | 1.75E−01 | −8.29E−02 | −4.35E−02 |
| C2 | −2.97E−07 | 7.04E−06 | −1.17E−05 | −1.87E−07 | 1.59E−06 |
| C3 | 1.03E−12 | 1.09E−10 | 1.34E−09 | −7.04E−10 | −6.81E−11 |
| C4 | 2.76E−14 | −2.90E−14 | −5.44E−14 | 6.65E−14 | 5.03E−15 |
| C5 | −1.51E−18 | −1.55E−21 | −1.82E−18 | −1.33E−17 | −1.68E−23 |
| C6 | −1.04E−24 | 5.61E−23 | 2.56E−22 | 2.46E−21 | −2.36E−23 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

|  | 17 | 18 | 23 | 31 | 32 |
|---|---|---|---|---|---|
| K | −197.849 | −204.054 | 0 | 0 | 0 |
| C1 | −2.94E−02 | 5.77E−02 | −7.06E−02 | 3.41E−02 | −4.85E−02 |

TABLE 2-continued (ASPHERIC CONSTANTS FOR FIG. 9):

| | | | | | |
|---|---|---|---|---|---|
| C2 | 2.63E−07 | −5.00E−07 | 4.11E−06 | 4.07E−08 | 9.88E−07 |
| C3 | −6.11E−12 | 2.67E−11 | −1.18E−10 | 8.10E−11 | 7.37E−11 |
| C4 | 1.11E−16 | −5.69E−16 | 2.92E−15 | −4.34E−15 | −6.56E−15 |
| C5 | −2.01E−21 | 1.89E−20 | −3.23E−20 | 7.59E−19 | 6.53E−19 |
| C6 | 2.08E−26 | −1.49E−25 | 2.18E−25 | −3.41E−23 | −2.88E−23 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | 34 | 40 | 43 |
|---|---|---|---|
| K | 0 | 0 | 0 |
| C1 | 1.59E−02 | −4.10E−02 | −3.89E−02 |
| C2 | −1.51E−06 | 3.04E−07 | 4.76E−06 |
| C3 | 6.62E−13 | 5.71E−11 | −2.23E−10 |
| C4 | 1.72E−15 | −1.72E−15 | 8.89E−15 |
| C5 | −9.36E−20 | −9.60E−22 | −2.41E−19 |
| C6 | 2.36E−24 | 3.81E−25 | 3.43E−24 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

What is claimed is:

1. An optical system having an optical axis, the optical system comprising:
a first polarization manipulator, comprising:
a first subelement having a non-planar, optically effective surface, the first subelement configured so that the first subelement changes a polarization state of light passing through the first subelement, a maximum effective retardation introduced by the first subelement along the optical axis being less than a quarter of a working wavelength of the optical system; and
a second subelement, the first subelement and the second subelement having mutually facing non-planar surfaces that are mutually complementary; and
a position manipulator configured to manipulate a relative position of the first and second subelements with respect to each other;
wherein:
during use of the optical system, the light follows a beam path through the optical system; and
the first and second subelements are arranged consecutively in the beam path.

2. An optical system as set forth in claim 1, wherein at least one of the mutually facing surfaces is aspheric.

3. An optical system as set forth in claim 1, wherein the first subelement is configured to change the polarization state for light passing therethrough via linear birefringence, circular birefringence and/or by a change in an amplitude relationship of orthogonal polarization states in dependence on the orientations thereof.

4. An optical system as set forth in one claim 1, wherein the first polarization manipulator is in a plane in which a paraxial subaperture ratio is at least 0.8.

5. An optical system as set forth in claim 1, wherein the first polarization manipulator is in a plane in which a paraxial subaperture ratio is at most 0.2.

6. An optical system as set forth in claim 1, further comprising a second polarization manipulator, wherein the second polarization manipulator comprises:
a third subelement having a non-planar, optically effective surface, the third subelement configured so that the third subelement changes a polarization state of light passing through the third subelement, a maximum effective retardation introduced by the third subelement along the optical axis being less than a quarter of a working wavelength of the optical system; and
a fourth subelement, the third subelement and the fourth subelement having mutually facing surfaces that are mutually complementary.

7. An optical system as set forth in claim 6, wherein the first polarization manipulator is in a first plane having a first paraxial subaperture ratio, the second polarization manipulator is in a second plane having a second paraxial subaperture ratio, and a difference between the first and second paraxial subaperture ratios is at least 0.1.

8. An optical system as set forth in claim 1, further comprising a wave front compensator configured to at least partially compensate a change, caused by the first polarization compensator, in a wave front of light passing through the optical system.

9. An optical system as set forth in claim 1, wherein at least one of the mutually facing surfaces has a coating.

10. An optical system as set forth in claim 1, wherein at least one of the mutually facing surfaces has a reflectivity of less than 2%.

11. An optical system as set forth in claim 1, wherein at least one of the first and second subelements comprises a material selected from the group consisting of a cubically crystalline material under compression or tensile stress, an amorphous material under compression or tensile stress, and an optically uniaxial crystalline material.

12. An optical system as set forth in claim 11, wherein at least one of the first and second subelements comprises a cubically crystalline material under compression or tensile stress, the cubically crystalline material being selected from the group consisting of calcium fluoride ($CaF_2$), barium fluoride ($BaF_2$), lithium barium fluoride ($LiBaF_3$), garnets, in particular lutetium aluminum garnet ($Lu_3Al_5O_{12}$) and yttrium aluminum garnet ($Y_3Al_5O_{12}$) and spinel.

13. An optical system as set forth in claim 1, wherein at least one of the first and second subelements comprises an optically uniaxial crystalline material selected from the group consisting of magnesium fluoride ($MgF_2$), lanthanum fluoride ($LaF_3$), sapphire ($Al_2O_3$) and crystalline quartz ($SiO_2$).

14. An optical system as set forth in claim 1, wherein the position manipulator is configured to effect at least one of the following changes in a position of at least one of the first and second subelements:
displacement of at least one of the first and second subelements in a direction perpendicular to the optical axis;

displacement of at least one of the first and second subelements in a direction parallel to the optical axis; and
rotation of at least one of the first and second subelements.

15. An optical system as set forth in claim 1, wherein the position manipulator is configured to rotate at least one of the first and second subelements about an axis of rotation which is parallel to the optical axis.

16. An optical system as set forth in claim 1, wherein the position manipulator is configured to rotate at least one of the first and second subelements about an axis of rotation which is not parallel to the optical axis.

17. An optical system as set forth in claim 1, wherein a maximum spacing between the first and second subelements is at most 0.5 mm.

18. An optical system as set forth in claim 1, wherein a gap is present between the first and second subelements, and the gap is at least partially filled with a fluid.

19. An optical system as set forth in claim 18, wherein the fluid comprises a liquid.

20. An optical system as set forth in claim 19, wherein the liquid has a refractive index which at a working wavelength of the optical system differs by less than 0.2 from a mean refractive index of the first and second subelements.

21. An optical system as set forth in claim 1, wherein the first and second subelements comprise the same material.

22. An optical system as set forth in claim 1, wherein the first and second subelements comprise different materials.

23. An optical system as set forth in claim 22, wherein the first polarization manipulator comprises both positively birefringent crystal material and also negatively birefringent crystal material.

24. An optical system as set forth in claim 1, wherein the first subelement and the second subelement respectively comprise an optically uniaxial crystal material, and an orientation of a crystal axis of the first subelement differs from an orientation of a crystal axis of the second subelement by an angle of more than 5°.

25. An optical system as set forth in claim 1, further comprising an interchange device configured to interchange the first polarization manipulator.

26. An optical system as set forth in claim 1, the first and second subelements can be positioned so that the first polarization manipulator leaves the polarization state of light passing therethrough unchanged.

27. An optical system as set forth in claim 1, wherein the optical system is configured to be used with a working wavelength of less than 400 nm.

28. An optical system as set forth in claim 1, wherein the optical system is configured to be used in a microlithographic projection exposure apparatus.

29. An optical system as set forth in claim 1, wherein the first polarization manipulator is configured so that the first polarization manipulator manipulates a wave front for p-polarized light passing through the first polarization manipulator differently from a wave front for s-polarized light passing through the first polarization manipulator, and a manipulation of a mean value of the wave fronts for p-polarized light and for s-polarized light is different from zero.

30. A polarization manipulator comprising:
a first subelement; and
a second subelement,
wherein:
the first and second subelements are configured to respectively cause a change in a polarization state for light passing therethrough;
the first and second subelements have mutually complementary aspheric surfaces facing each other;
by manipulation of a relative position of the first and second subelements relative to each other, a polarization state, that varies with the manipulation, is changed; and
the first and second subelements can be positioned so that the polarization manipulator leaves the polarization state of light passing therethrough unchanged;
wherein:
during use of the polarization manipulator, the light follows a beam path through the polarization manipulator; and
the first and second subelements are arranged consecutively in the beam path.

31. A polarization manipulator, comprising:
a first subelement; and
a second subelement,
wherein:
the first and second subelements respectively cause a change in a polarization state for light passing therethrough;
the first and second subelements have mutually complementary non-planar surfaces facing each other;
by manipulation of a relative position of the first and second subelements relative to each other, a polarization state, that varies with the manipulation, is changed;
during use of the polarization manipulator, the light follows a beam path through the polarization manipulator;
the first and second subelements are arranged consecutively in the beam path; and
during use of the polarization manipulator, the polarization manipulator is configured so that a wave front for p-polarized light passing therethrough and a wave front for s-polarized light passing therethrough are manipulated by the polarization manipulator different from each other, and a manipulation of the mean value of the wave fronts for p-polarized light and for s-polarized light is different from zero.

32. An apparatus, comprising:
an illumination system; and
a projection objective,
wherein the apparatus is a microlithographic projection exposure apparatus, and the illumination system and/or the projection objective comprises an optical system as set forth in claim 1.

33. An apparatus as set forth in claim 32, wherein the projection objective has a numerical aperture of more than 0.85.

34. An apparatus as set forth in claim 32, wherein the apparatus is configured to be used in an immersion mode of operation.

35. An apparatus as set forth claim 32, wherein the polarization manipulator is configured so that, for a first disturbance of a mean value of the wave fronts for p- and s-polarized light and a second disturbance of a difference value of the wave fronts for p- and s-polarized light, the first and second disturbance are each at least partially compensated by the polarization manipulator.

36. A process, comprising:
using an apparatus as set forth in claim 32 to project at least a part of a mask having structures onto a region of a light sensitive layer supported by a substrate.

* * * * *

UNITED STATES PATENT AND TRADEMARK OFFICE
CERTIFICATE OF CORRECTION

| | | |
|---|---|---|
| PATENT NO. | : 8,379,188 B2 | Page 1 of 1 |
| APPLICATION NO. | : 12/782831 | |
| DATED | : February 19, 2013 | |
| INVENTOR(S) | : Ralf Mueller et al. | |

It is certified that error appears in the above-identified patent and that said Letters Patent is hereby corrected as shown below:

In the Specifications:

1.) Column 8, Section "Brief Description Of The Drawings", Lines 35-38:
   Delete:
      "FIG. 1 shows a diagrammatic view of a polarization manipulator in a first exemplary embodiment, shows a diagrammatic view of a polarization manipulator in a further exemplary embodiment,".
   Insert:
      --FIG. 1 shows a diagrammatic view of a polarization manipulator in a first exemplary embodiment,
      FIG. 2 shows a diagrammatic view of a polarization manipulator in a further exemplary embodiment,--.

In the Claims:

2.) Column 15, Line 53, Claim 4: delete "in one claim" and insert --in claim--.

Signed and Sealed this
Thirteenth Day of August, 2013

Teresa Stanek Rea
*Acting Director of the United States Patent and Trademark Office*